United States Patent
Kishimoto et al.

(10) Patent No.: US 12,432,865 B2
(45) Date of Patent: Sep. 30, 2025

(54) FOLDABLE ELECTRONIC DEVICE INCLUDING SUPPORT LAYER INCLUDING REINFORCEMENT FIBER

(71) Applicant: Samsung Display Co., Ltd., Yongin-si (KR)

(72) Inventors: Hirotsugu Kishimoto, Hwaseong-si (KR); Dasom Gu, Asan-si (KR); Sungguk An, Suwon-si (KR); Yonghyuck Lee, Cheonan-si (KR); Chul Ho Jeong, Seoul (KR); Hyunjun Cho, Seoul (KR); Sohra Han, Cheonan-si (KR); Seungkyun Hong, Cheonan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 434 days.

(21) Appl. No.: 17/960,417

(22) Filed: Oct. 5, 2022

(65) Prior Publication Data

US 2023/0114397 A1 Apr. 13, 2023

(30) Foreign Application Priority Data

Oct. 7, 2021 (KR) .................. 10-2021-0132910

(51) Int. Cl.
*H05K 5/02* (2006.01)
*B32B 3/26* (2006.01)
(Continued)

(52) U.S. Cl.
CPC .......... *H05K 5/0217* (2013.01); *B32B 3/266* (2013.01); *B32B 5/12* (2013.01); *B32B 15/14* (2013.01);
(Continued)

(58) Field of Classification Search
CPC ...... H05K 5/0217; H05K 9/0054; H05K 9/00; H05K 5/00; H05K 5/0047; H05K 5/0226;
(Continued)

(56) References Cited

U.S. PATENT DOCUMENTS 9,356,246 B2 5/2016 Kawata
9,614,022 B2 4/2017 Miyake et al.
(Continued)

FOREIGN PATENT DOCUMENTS

KR 1020140113017 A 9/2014
KR 1020150075367 A 7/2015
(Continued)

OTHER PUBLICATIONS

Takuji Arima, Study on Elucidation of Antenna Radiation Efficiency Degradation Mechanism and Development for Improvement Method, Tokyo University of Agriculture and Technology, pp. 1-25, No. 32 (2017).

*Primary Examiner* — Nathan S Taylor
(74) *Attorney, Agent, or Firm* — CANTOR COLBURN LLP

(57) ABSTRACT

An electronic device includes a display panel having a folding region, which is foldable with respect to a folding axis extending in one direction, and a first non-folding region and a second non-folding region spaced apart from each other with the folding region therebetween, and a lower member disposed below the display panel. The lower member includes a support layer disposed below the display panel, where the support layer includes a first support portion overlapping the first non-folding region, and a second support portion overlapping the second non-folding region, and a digitizer disposed below the display panel and corresponds to the first support portion and the second support portion. The first support portion and the second support portion each independently include a reinforcement (Continued)

fiber, where the reinforcement fiber includes an aramid fiber or includes a carbon fiber and a glass fiber.

19 Claims, 23 Drawing Sheets

(51) Int. Cl.
*B32B 5/12* (2006.01)
*B32B 15/14* (2006.01)
*H05K 9/00* (2006.01)

(52) U.S. Cl.
CPC .... *H05K 9/0054* (2013.01); *B32B 2262/0269* (2013.01); *B32B 2457/208* (2013.01)

(58) Field of Classification Search
CPC .......... H05K 5/04; H05K 5/15; H05K 5/0018; B32B 5/266; B32B 15/12; B32B 15/14; B32B 2262/0269; B32B 2457/208; B32B 5/26; G06F 1/1652; G06F 3/0412; G06F 9/301; G06F 1/16; G06F 3/041; G06F 9/30; G06F 1/1601; G06F 1/1637; H04M 1/0214; H04M 1/0268; H04M 1/02; H04M 1/0206; H04M 1/021; H04M 1/0212; H04M 1/0216; H04M 1/0218; H04M 1/022; H04M 1/0222; H04M 1/0243; H04M 1/0247; H04M 1/0249; H10K 77/111; H10K 50/84; H10K 59/40; H10K 77/10; C08K 7/02; C08K 7/06; C08K 7/14; H04W 88/02

See application file for complete search history.

(56) References Cited

U.S. PATENT DOCUMENTS

| | | | |
|---|---|---|---|
| 9,977,524 B2 | 5/2018 | Nakamura et al. | |
| 10,067,536 B1 * | 9/2018 | Watamura | G06F 1/1652 |
| 11,455,915 B2 | 9/2022 | Cho et al. | |
| 11,543,904 B2 | 1/2023 | Bok et al. | |
| 2005/0204889 A1 * | 9/2005 | Swingle et al. | 84/100 |
| 2013/0190052 A1 * | 7/2013 | Lundell | 455/575.1 |
| 2015/0179717 A1 * | 6/2015 | Kawata | H01L 27/3244 |
| 2015/0185784 A1 * | 7/2015 | Watabe et al. | G06F 1/1656 |
| 2017/0346164 A1 * | 11/2017 | Kim et al. | H01Q 1/243 |
| 2018/0329454 A1 * | 11/2018 | Aurongzeb et al. | G06F 1/1616 |
| 2020/0401275 A1 * | 12/2020 | Shin | G06F 3/0445 |
| 2021/0107177 A1 * | 4/2021 | Giles | E04B 1/35 |
| 2021/0124397 A1 * | 4/2021 | Mizoguchi et al. | G06F 1/1641 |
| 2021/0318381 A1 * | 10/2021 | Chang et al. | G01B 31/3646 |
| 2021/0382367 A1 * | 12/2021 | Hashimoto et al. | G02F 1/167 |
| 2022/0011819 A1 | 1/2022 | Shin et al. | |
| 2022/0061169 A1 * | 2/2022 | Shin et al. | H05K 5/0017 |
| 2024/0174801 A1 * | 5/2024 | Di Lena | C08K 3/34 |
| 2024/0199878 A1 * | 6/2024 | Ogawa | C08G 73/1078 |

FOREIGN PATENT DOCUMENTS

| | | | | |
|---|---|---|---|---|
| KR | 1020150107621 A | | 9/2015 | |
| KR | 1020160119798 A | | 10/2016 | |
| KR | 102048360 B1 | * | 11/2019 | G06F 9/00 |
| KR | 1020210013867 A | | 2/2021 | |
| KR | 1020210073253 A | | 6/2021 | |
| KR | 1020210086907 A | | 7/2021 | |
| KR | 1020220006669 A | | 1/2022 | |
| TW | 550987 B | * | 9/2003 | H05K 1/03 |

* cited by examiner

FOLDABLE ELECTRONIC DEVICE INCLUDING SUPPORT LAYER INCLUDING REINFORCEMENT FIBER

This application claims priority to Korean Patent Application No. 10-2021-0132910, filed on Oct. 7, 2021, and all the benefits accruing therefrom under 35 U.S.C. § 119, the content of which in its entirety is herein incorporated by reference.

BACKGROUND

1. Field

Embodiments of the disclosure herein relate to an electronic device, and more particularly, to a foldable electronic device.

2. Description of the Related Art

Electronic equipment for providing a user with an image, such as a smartphone, a digital camera, a notebook computer, a navigation device and a smart television, includes an electronic device for displaying an image. The electronic device generates an image and provides a user with the image through a display screen thereof.

Recently, with the technical development of electronic devices, electronic devices having various shapes have been developed. For example, various flexible electronic devices, which are deformed in a curved shape or are foldable or rollable, have been developed. The flexible electronic devices having variously changeable shapes are portable and improve user's convenience.

A foldable electronic device among the flexible electronic devices includes a display module that is folded with respect to a folding axis extending in one direction. In such a foldable electronic device, the display module is folded or unfolded with respect to the folding axis.

SUMMARY

Embodiments of the disclosure provide a foldable electronic device including a support layer suitable for driving a digitizer module.

An embodiment of the invention provides an electronic device including a display panel having a folding region, which is foldable with respect to a folding axis extending in one direction, and a first non-folding region and a second non-folding region spaced apart from each other with the folding region therebetween, and a lower member disposed below the display panel. In such an embodiment, the lower member includes a support layer disposed below the display panel, where the support layer includes a first support portion overlapping the first non-folding region, and a second support portion overlapping the second non-folding region, and a digitizer disposed below the display panel to correspond to the first support portion and the second support portion. In such an embodiment, the first support portion and the second support portion each independently include a reinforcement fiber, where the reinforcement fiber includes an aramid fiber or includes a carbon fiber and a glass fiber.

In an embodiment, the reinforcement fiber may include a plurality of first fibers extending in the one direction, and a plurality of second fibers extending to cross the plurality of first fibers on a plane.

In an embodiment, the support layer may include a plurality of sub-support layers in which an arrangement direction of the reinforcement fiber are different from each other. In such an embodiment, the plurality of sub-support layers may be stacked along a thickness direction.

In an embodiment, the plurality of sub-support layers may include a first sub-support layer including the plurality of first fibers arranged parallel with the one direction, and a second sub-support layer including the plurality of second fibers arranged parallel with a direction perpendicular to the one direction.

In an embodiment, each of the first support portion and the second support portion may further include a matrix part in which the reinforcement fiber is dispersed.

In an embodiment, the support layer may further include a folding portion disposed between the first support portion and the second support portion to correspond to the folding region, where a plurality of opening portions may be defined in the folding portion.

In an embodiment, the folding portion may include the reinforcement fiber.

In an embodiment, the folding portion may include a metal.

In an embodiment, the digitizer may be disposed between the display panel and the support layer.

In an embodiment, the digitizer may be disposed below the support layer.

In an embodiment, the digitizer may include a first digitizer including a first sensing region corresponding to the first support portion, and a second digitizer including a second sensing region corresponding to the second support portion, where the second digitizer may be spaced apart from the first digitizer.

In an embodiment, the lower member may further include an electromagnetic shielding layer disposed below the digitizer, and a lower metal plate disposed below the electromagnetic shielding layer.

In an embodiment, the lower member may further include a cover layer disposed below the support layer and overlapping the folding region, the first non-folding region and the second non-folding region.

In an embodiment of the invention, an electronic device includes a display panel having a folding region folded with respect to a folding axis extending in one direction, and a first non-folding region and a second non-folding region spaced apart from each other with the folding region therebetween; and a lower member disposed below the display panel. In such an embodiment, the lower member includes a support layer disposed below the display panel, where the support layer includes a first support portion overlapping the first non-folding region, and a second support portion overlapping the second non-folding region. In such an embodiment, the first support portion and the second support portion each independently include a reinforcement fiber, where the reinforcement fiber includes an aramid fiber or includes at least two selected from the aramid fiber, a carbon fiber and a glass fiber.

In an embodiment, the reinforcement fiber may include a plurality of first fibers extending in the one direction, and a plurality of second fibers extending to cross the plurality of first fibers on a plane.

In an embodiment, the electronic device may further include a digitizer disposed between the display panel and the support layer. The digitizer may overlap the first non-folding region, the folding region and the second non-folding region.

In an embodiment, the electronic device may further include a digitizer disposed below the support layer. In such an embodiment, the digitizer may include a first digitizer including a first sensing region corresponding to the first support portion, and a second digitizer including a second sensing region corresponding to the second support portion, where the second digitizer may be spaced apart from the first digitizer.

In an embodiment, the support layer may further include a folding portion disposed between the first support portion and the second support portion to correspond to the folding region, where a plurality of opening portions may be defined in the folding portion.

In an embodiment, the folding portion may include a metal.

In an embodiment, the folding portion may include the reinforcement fiber, and the first support portion, the second support portion and the folding portion may be integrally formed with each other as a single unit.

BRIEF DESCRIPTION OF THE DRAWINGS

The above and other features of the invention will become more apparent by describing in further detail embodiments thereof with reference to the accompanying drawings, in which.

DETAILED DESCRIPTION

Figure 1A:
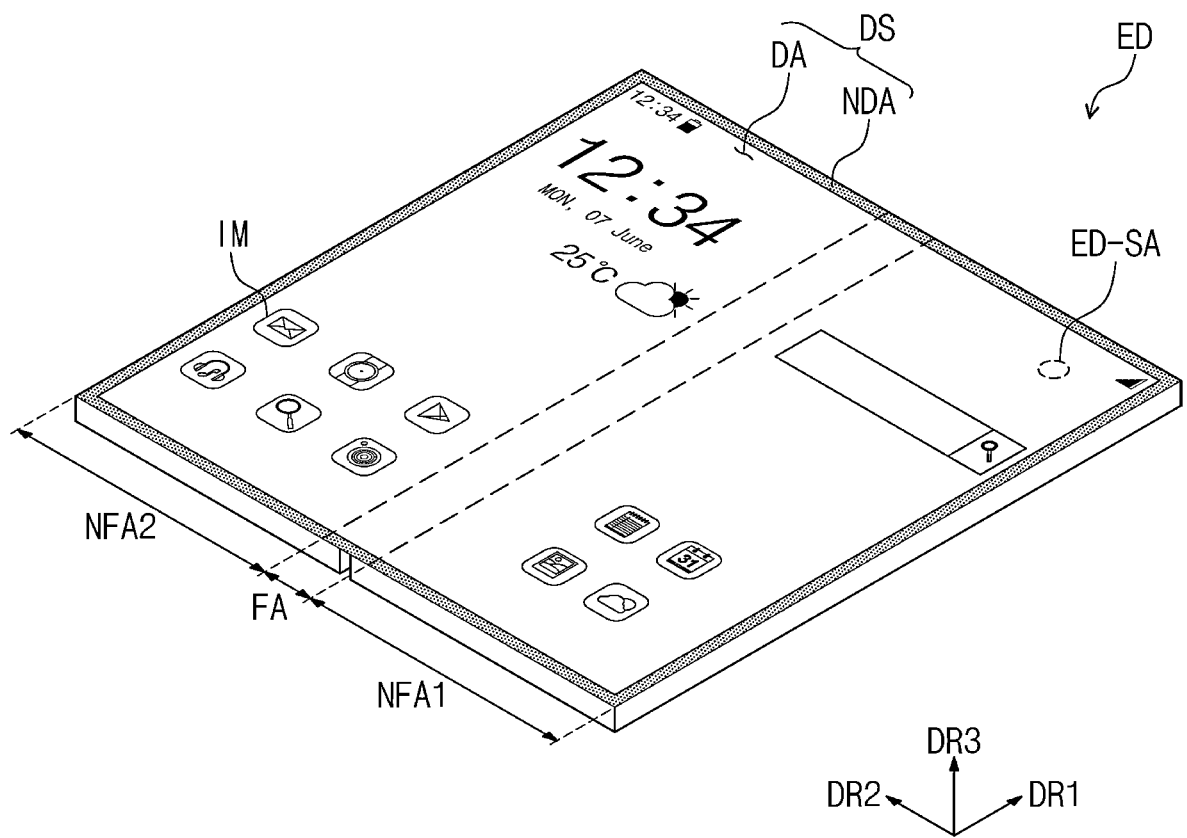
FIGS. 1A and 1B are perspective views of an electronic device according to an embodiment of the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

It will be understood that when an element (or region, layer, section, etc.) is referred to as being "on", "connected to" or "coupled to" another element, it can be disposed directly on, connected or coupled to the other element or a third intervening element may be disposed between the elements. In contrast, when an element is referred to as being "directly on" another element, there are no intervening elements present.

Like reference numbers or symbols refer to like elements throughout. In addition, in the drawings, the thickness, the ratio, and the dimension of elements are exaggerated for effective description of the technical contents. "Or" means "and/or." As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another element. For example, a first element could be termed a second element without departing from the teachings of the invention, and similarly, a second element could be termed a first element.

In addition, the terms, such as "below", "beneath", "on" and "above", are used for explaining the relation of elements shown in the drawings. The terms are relative concept and are explained based on the direction shown in the drawing.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described with reference to the accompanying drawings.

Figure 1B:
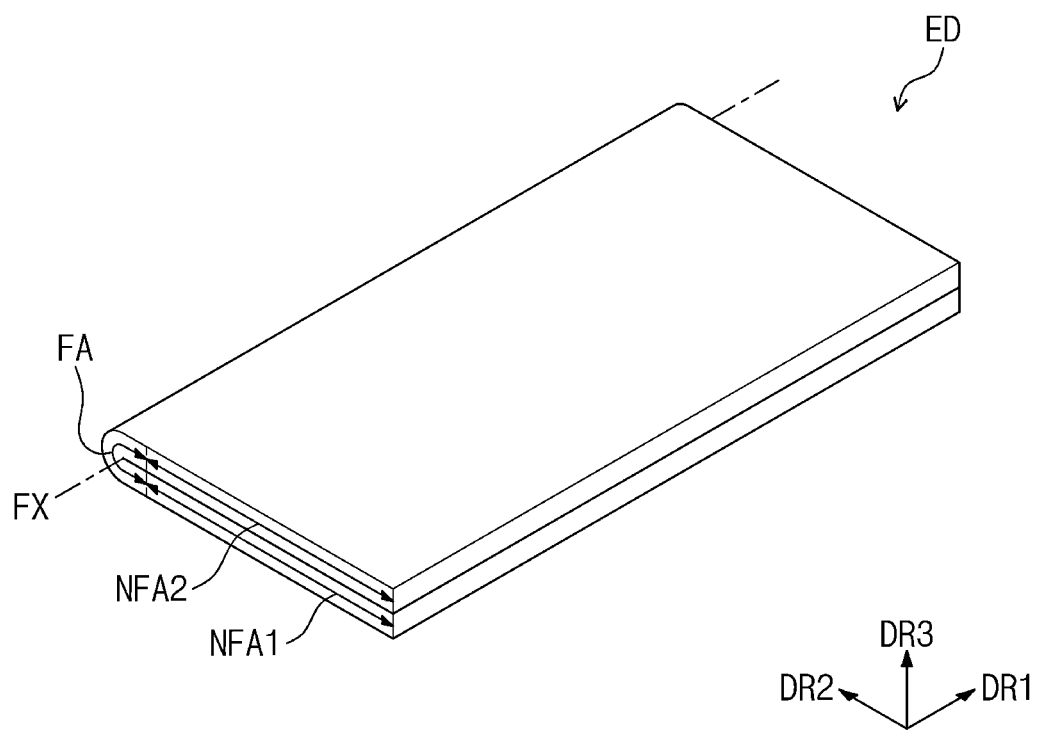

FIGS. 1A and 1B are perspective views of an electronic device ED according to an embodiment of the invention. FIG. 1A illustrates an embodiment of an electronic device ED in a state in which the electronic device ED is spread (or unfolded), and FIG. 1B illustrates an embodiment of an electronic device ED in a state in which the electronic device ED is folded.

Referring to FIGS. 1A and 1B, an embodiment of the electronic device ED according to the invention may include a display surface DS defined by a first direction DR1 and a second direction DR2 crossing the first direction DR1. The electronic device ED may provide a user with an image IM through the display surface DS.

The display surface DS may include a display region DA and a non-display region NDA around the display region DA. The display region DA may display the image IM, and the non-display region NDA may not display the image IM. The non-display region NDA may surround the display region DA. However, an embodiment of the invention is not limited thereto, and alternatively, the shape of the display region DA and the shape of the non-display region NDA may be changed or modified.

Hereinafter, a third direction DR3 is defined as a direction substantially perpendicularly crossing a plane defined by the first direction DR1 and the second direction DR2. In the disclosure, "on a plane" may be defined as a state as seen in the third direction DR3 or when viewed in a plan view in the third direction DR3.

A sensing region ED-SA may be defined in the display region DA of the electronic device ED. FIG. 1A illustrates an embodiment including a single sensing region ED-SA, but the number of the sensing region ED-SA is not limited thereto. The sensing region ED-SA may be a part of the display region DA. Thus, the electronic device ED may display an image through the sensing region ED-SA.

An electronic module may be disposed in a region overlapping the sensing region ED-SA. The electronic module may receive an external input transmitted through the sensing region ED-SA or provide an output through the sensing region ED-SA. In an embodiment, for example, the electronic module may be a camera module, a distance measuring sensor such as a proximity sensor, a sensor for recognizing a user's body part (e.g., fingerprint, iris or face), or a small lamp for outputting light, and is not particularly limited thereto. Hereinafter, for convenience of description, embodiments where the electronic module overlapping the sensing region ED-SA is a camera module will be described in detail.

The electronic device ED may include a folding region FA and a plurality of non-folding regions NFA1 and NFA2. The non-folding regions NFA1 and NFA2 may include a first non-folding region NFA1 and a second non-folding region NFA2. In the second direction DR2, the folding region FA may be disposed between the first non-folding region NFA1 and the second non-folding region NFA2. The folding region FA may be referred to as a foldable region, and the first and second non-folding regions NFA1 and NFA2 may be referred to as first and second non-foldable regions.

As illustrated in FIG. 1B, the folding region FA may be folded with respect to a folding axis FX parallel with the first direction DR1. The folding region FA has a predetermined curvature and radius of curvature in a state where the electronic device ED is folded. The electronic device ED may be in-folded so that the first non-folding region NFA1 and the second non-folding region NFA2 face each other and the display surface DS is not exposed to the outside.

In an embodiment of the invention, the electronic device ED may be out-folded so that the display surface DS is exposed to the outside. In an embodiment of the invention, the electronic device ED may be configured to repeat an operation from an unfolding operation to an in-folding or out-folding operation, or vice versa, but an embodiment of the invention is not limited thereto. In an embodiment of the invention, the electronic device ED may be configured to select any one among an unfolding operation, an in-folding operation and an out-folding operation.

FIGS. 1A and 1B illustrate an embodiment where the electronic device is a foldable electronic device ED, but an embodiment of the invention is not limited to the foldable electronic device ED. In an alternative embodiment, the electronic device may be a rigid electronic device, for example, an electronic device that does not include the folding region FA.

Figure 2A:
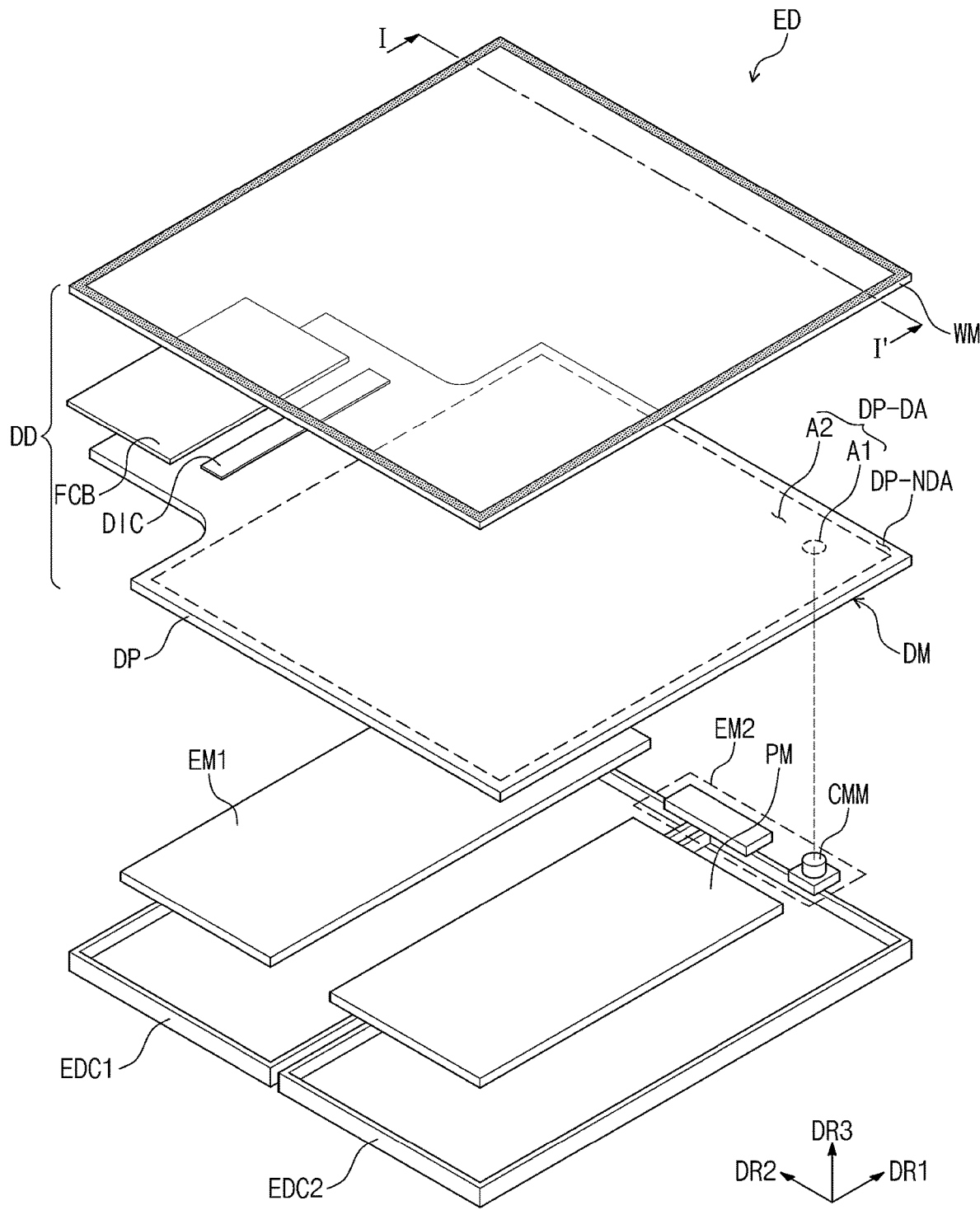
FIG. 2A is an exploded perspective view of an electronic device according to an embodiment of the invention.
Figure 2B:
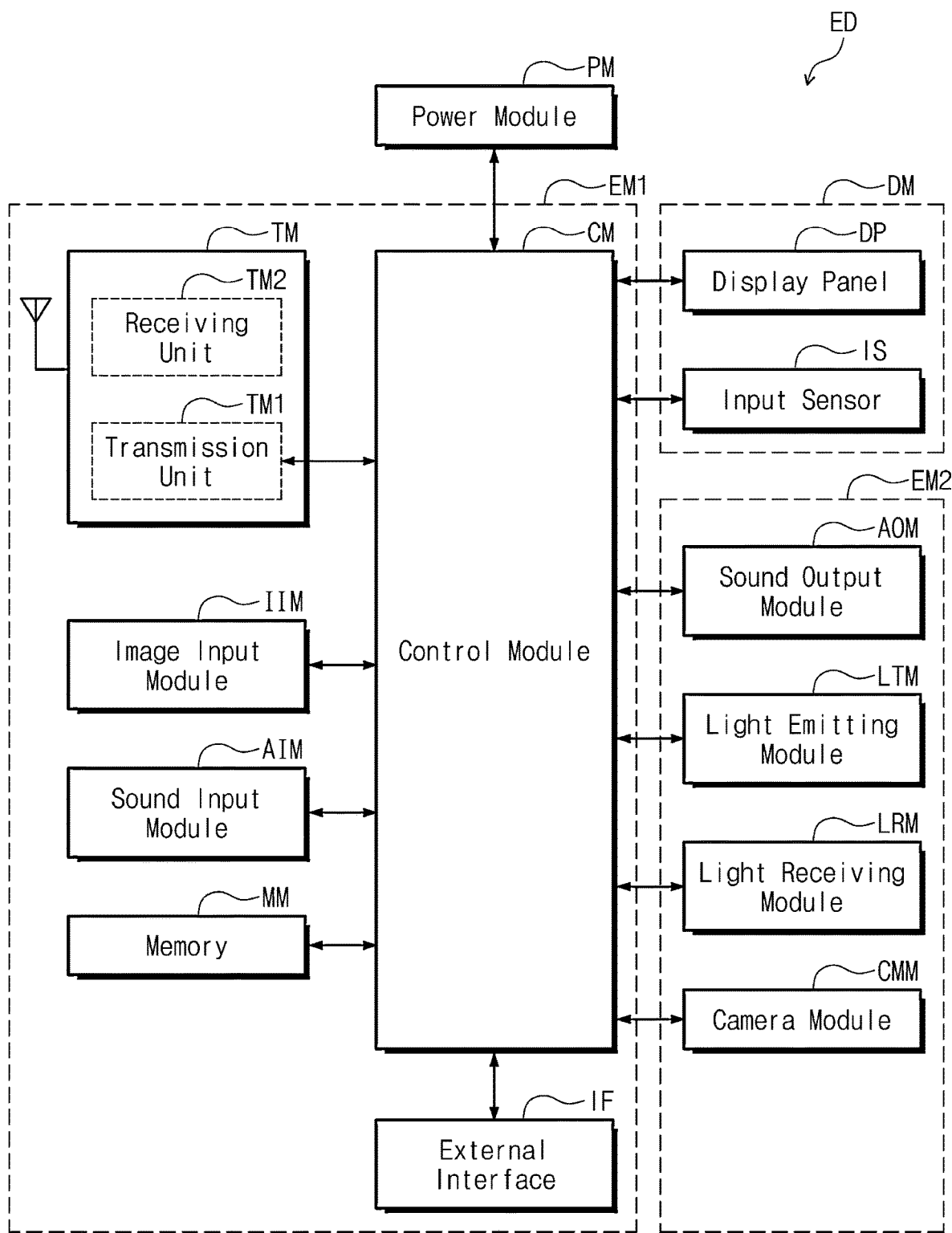
FIG. 2B is a block diagram of an electronic device according to an embodiment of the invention.

FIG. 2A is an exploded perspective view of an electronic device ED according to an embodiment of the invention. FIG. 2B is a block diagram of an electronic device ED according to an embodiment of the invention.

Referring to FIGS. 2A and 2B, an embodiment of the electronic device ED may include a display device DD, a first electronic module EM1, a second electronic module EM2, a power module PM and a housing EDC1 and EDC2. Although not separately illustrated, the electronic device ED may further include a mechanism structure for controlling a folding operation of the display device DD.

The display device DD includes a window module WM and a display module DM. The window module WM provides a front surface of the electronic device ED. The display module DM may include a display panel DP. The display module DM generates an image and detects an external input.

FIGS. 2A and 2B illustrate that the display module DM is defined by the display panel DP, but the display module DM may be substantially defined by a stacked structure in which a plurality of components including the display panel DP are stacked one on another. The stacked structure of the display module DM will be described in detail later.

The display panel DP includes a display region DP-DA and a non-display region DP-NDA which respectively correspond to the display region DA (see FIG. 1A) and the non-display region NDA (see FIG. 1A) of the electronic device ED. In the disclosure, the phrase, "a region/portion corresponds to another region/portion" means that the regions/portions overlap each other, and is not limited to the regions/portions having a same area as each other.

The display region DP-DA may include a first region A1 and a second region A2. The first region A1 may overlap or correspond to the sensing region ED-SA (see FIG. 1A) of the electronic device ED. In an embodiment, the first region A1 has a circular shape, as shown in FIG. 2A. However, the first region A1 may have various shapes such as polygon, oval, figure with at least one curved side, or atypical shape, and is not limited to any one embodiment. The first region A1 may be referred to as a component region, and the second region A2 may be referred to as a main display region or a general display region.

The first region A1 may have a higher transmittance than the second region A2. In addition, the first region A1 may have a lower resolution than the second region A2. The first region A1 may overlap a camera module CMM to be described later.

The display module DM may include a display panel DP and an input sensor IS.

The display panel DP may be a component that substantially generates an image. The display panel DP may be a light-emitting display panel. The display panel DP may include, for example, an organic light-emitting display layer, an inorganic light-emitting display layer, an organic-inorganic light-emitting display layer, a quantum dot display layer, a micro light emitting diode ("LED") display layer, a nano LED display layer or the like.

The input sensor IS may detect an external input applied from the outside. The external input may be a user's input. The user's input may include various types of external inputs such as a part of a user's body, light, heat, pen or pressure.

The display module DM may include a driving chip DIC disposed on the non-display region DP-NDA. The display module DM may further include a flexible circuit film FCB coupled to the non-display region DP-NDA.

The driving chip DIC may include driving elements, for example, a data driving circuit, for driving pixels of the display panel DP. FIG. 2A illustrates an embodiment having a structure in which the driving chip DIC is mounted on the display panel DP, but an embodiment of the invention is not limited thereto. In an alternative embodiment, for example, the driving chip DIC may be mounted on the flexible circuit film FCB.

The power module PM supplies power used for the overall operation of the electronic device ED. The power module PM may include a typical or commercially available battery module.

The first electronic module EM1 and the second electronic module EM2 include various functional modules for operating the electronic device ED. Each of the first electronic module EM1 and the second electronic module EM2 may be mounted directly on a motherboard electrically connected to the display panel DP or may be mounted on a separate substrate to be electrically connected to the motherboard through a connector (not illustrated) or the like.

The first electronic module EM1 may include a control module CM, a wireless communication module TM, an image input module IIM, a sound input module AIM, a memory MM and an external interface IF.

The control module CM controls the overall operation of the electronic device ED. The control module CM may be a microprocessor. In an embodiment, for example, the control module CM activates or inactivates the display panel DP. The control module CM may control other modules such as the image input module IIM or the sound input module AIM, based on a touch signal received from the display panel DP.

The wireless communication module TM may communicate with an external electronic device through a first network (for example, a near field communication network such as Bluetooth®, WiFi® direct or infrared data association (IrDA)) or a second network (for example, a wide area communication network such as cellular network, internet or computer network (e.g., LAN or WAN)). Communication modules included in the wireless communication module TM may be integrated into a single component (for example, a single chip) or embodied as a plurality of components separated from each other (for example, a plurality of chips). The wireless communication module TM may transmit/receive an audio signal using a general communication channel. The wireless communication module TM may include a transmission unit TM1 that modulates and transmits a signal to be transmitted, and a receiving unit TM2 that demodulates a signal received.

The image input module IIM processes an image signal to convert the image signal to image data displayable on the display device DD. The sound input module AIM receives an external sound signal through a microphone in a recording mode, an audio recognition mode, etc., and converts the external audio signal to an electrical audio data.

The external interface IF may include a connector capable of physically connecting the electronic device ED and an external electronic device. In an embodiment, for example, the external interface IF serves as an interface connected to an external charger, a wired/wireless data port, a card socket (e.g., a memory card and a SIM/UIM card), etc.

The second electronic module EM2 may include a sound output module AOM, a light-emitting module LTM, a light-receiving module LRM, a camera module CMM, etc. The sound output module AOM converts sound data received from the wireless communication module TM, or sound data stored in the memory MM, and outputs the converted result to the outside.

The light-emitting module LTM generates and outputs light. The light-emitting module LTM may output infrared light. The light-emitting module LTM may include a LED element. The light-receiving module LRM may detect infrared light. The light-receiving module LRM may be activated when infrared light the level of which is above a predetermined level, is detected. The light-receiving module LRM may include a complementary metal-oxide-semiconductor ("CMOS") sensor. After the infrared light generated from the light-emitting module LTM is output, the infrared light may be reflected by an external object (e.g., a user's finger or face) and the reflected infrared light may be incident into the light-receiving module LRM.

The camera module CMM may capture a still image and a moving image. The camera module CMM may be provided in plurality. Some of the plurality of camera modules CMM may overlap the first region A1. An external input (e.g., light) may be supplied to the camera module CMM through the first region A1. In an embodiment, for example, the camera module CMM may receive natural light through the first region A1 to capture the external image.

The housing EDC1 and EDC2 accommodates the display module DM, the first and second electronic modules EM1 and EM2, and the power module PM. The housing EDC1 and EDC2 protects components accommodated in the housing EDC1 and EDC2, such as the display module DM, the first and second electronic modules EM1 and EM2, and the power module PM. FIG. 2A illustrates an embodiment including two housings EDC1 and EDC2 separated from each other, but an embodiment of the invention is not limited thereto. Although not illustrated, the electronic device ED may further include a hinge structure for connecting the two housings EDC1 and EDC2. The housings EDC1 and EDC2 may be coupled to the window module WM.

Figure 3:
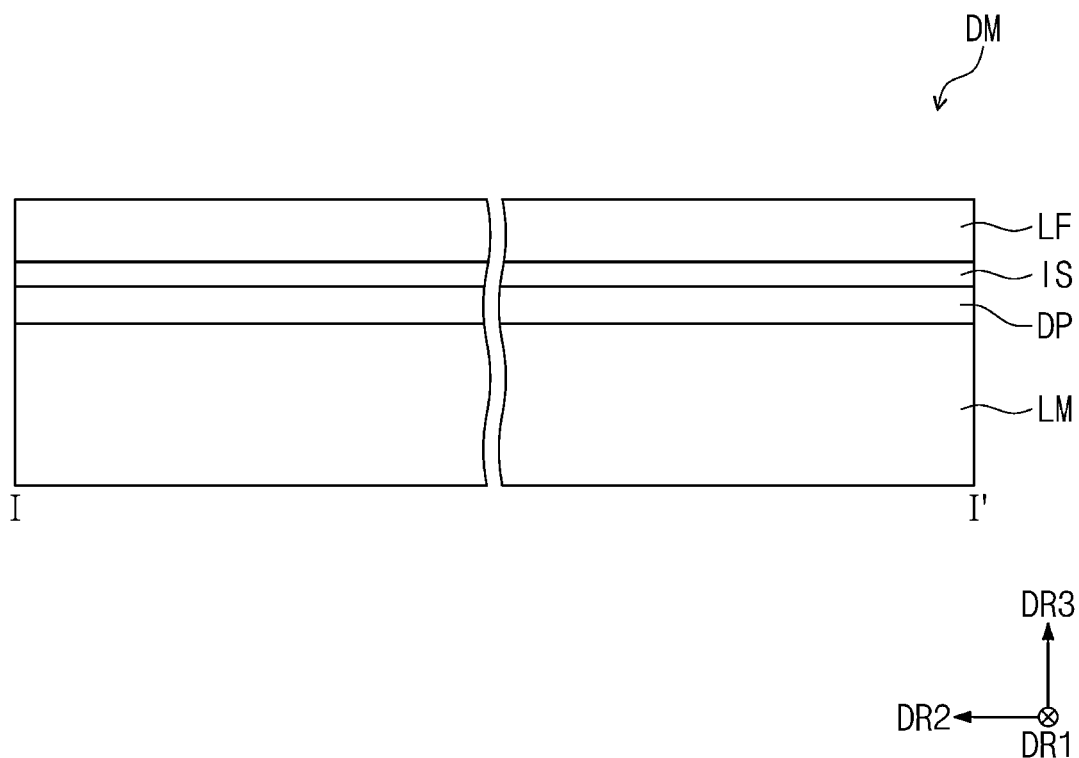
FIG. 3 is a cross-sectional view of a display module according to an embodiment of the invention.

FIG. 3 is a cross-sectional view of a display module according to an embodiment of the invention.

Referring to FIG. 3, an embodiment of a display module DM may include a display panel DP, an input sensor IS disposed on the display panel DP, an anti-reflective layer LF disposed on the input sensor IS, and a lower member LM disposed below the display panel DP. In such an embodiment, an adhesive layer may be selectively disposed between the members.

The display panel DP may include a base layer, a circuit element layer disposed on the base layer, a display element layer disposed on the circuit element layer, and a thin-film encapsulation layer disposed on the display element layer. The base layer may include a plastic film. In an embodiment, for example, the base layer may include polyimide. The planar shape of the base layer is substantially the same as the planar shape a display panel DP illustrated in FIG. 4, which will be described later.

The circuit element layer may include an organic layer, an inorganic layer, a semiconductor pattern, a conductive pattern, a signal line, etc. The organic layer, the inorganic layer, a semiconductor layer and a conductive layer may be formed on the base layer through coating, deposition or the like. Thereafter, the organic layer, the inorganic layer, the semiconductor layer and the conductive layer may be selectively patterned by performing a photolithography process multiple times and thus, the semiconductor pattern, the conductive pattern and the signal line may be formed.

The semiconductor pattern, the conductive pattern and the signal line may form a pixel driving circuit for pixels PX and signal lines SL1-SLm, DL1-DLn, ECL1-ECLm, CSL1, CSL2 and PL illustrated in FIG. 4, which will be described later. The pixel driving circuit may include at least one transistor.

The display element layer includes light-emitting elements of pixels PX illustrated in FIG. 4, which will be described later. The light-emitting element is electrically connected to the at least one transistor. The thin-film encapsulation layer may be disposed on the circuit element layer to seal the display element layer. The thin-film encapsulation layer may include an inorganic layer, an organic layer and an inorganic layer which are sequentially stacked one on another. A stacked structure of the thin-film encapsulation layer is not particularly limited.

The input sensor IS may include a plurality of sensing electrodes (not illustrated) for detecting an external input, trace lines (not illustrated) connected to the plurality of sensing electrodes, and an inorganic layer and/or an organic layer for insulating/protecting the plurality of sensing electrodes or the trace lines. The input sensor IS may include a capacitance type sensor, but is not particularly limited.

The anti-reflective layer LF may reduce external light reflectance. The anti-reflective layer LF may include a phase retarder and/or a polarizer. The anti-reflective layer LF may include at least a polarizing film.

The lower member LM may include various functional members. The lower member LM may include, for example, a light-shielding layer that shields light incident into the display panel DP, an impact absorption layer that absorbs an external impact, a support layer that supports the display panel DP, a heat release layer that releases heat generated from the display panel DP. A stacked structure of the lower member LM is not particularly limited.

Figure 4:
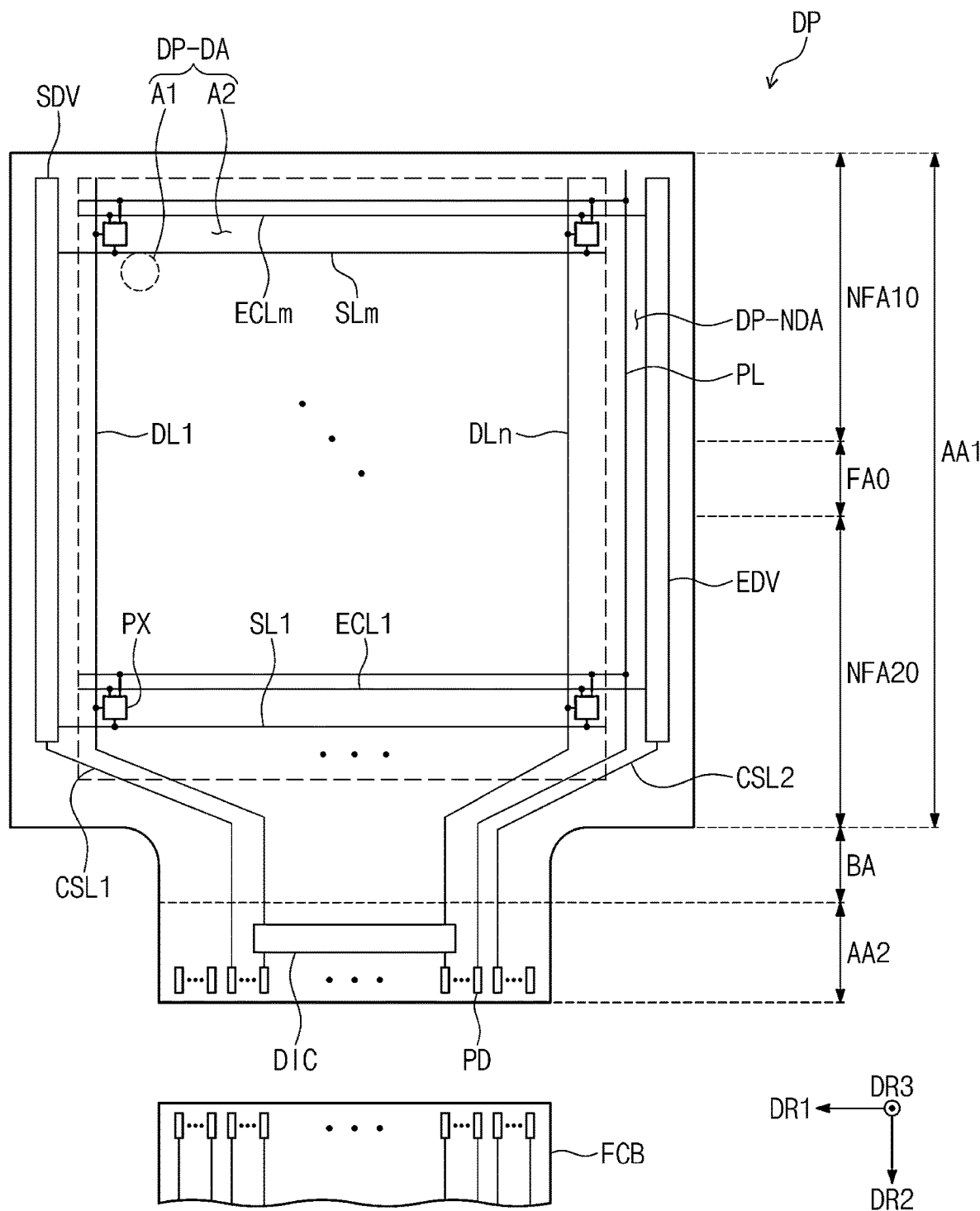
FIG. 4 is a plan view of a display panel according to an embodiment of the invention.

FIG. 4 is a plan view of a display panel DP according to an embodiment of the invention.

Referring to FIG. 4, in an embodiment of a display panel DP, a display region DP-DA and a non-display region DP-NDA around the display region DP-DA may be defined. The display region DP-DA and the non-display region DP-NDA are discriminated or defined distinctively from each other based on whether a pixel PX is present or not. The pixel PX is disposed in the display region DP-DA. In the non-display region DP-NDA, a scan driving unit SDV, a data driving unit and a light-emitting driving unit EDV may be disposed. The data driving unit may be a partial circuit included in a driving chip DIC.

The display region DP-DA may include a first region A1 and a second region A2. The first region A1 and the second region A2 are discriminated from each other according to the array spacing of pixels PX, the size of pixels PX, or whether a transmitting region TP (see FIG. 5) is present or not. The first region A1 and the second region A2 will be described in detail later.

The display panel DP may include a first panel region AA1, a bending region BA and a second panel region AA2, which are defined along the second direction DR2. The second panel region AA2 and the bending region BA may be some regions of the non-display region DP-NDA. The bending region BA is disposed between the first panel region AA1 and the second panel region AA2.

The first panel region AA1 is a region corresponding to the display surface DS in FIG. 1A. The first panel region AA1 may include a first non-folding region NFA10, a second non-folding region NFA20 and a folding region FAO. The first non-folding region NFA10, the second non-folding region NFA20 and the folding region FAO respectively correspond to the first non-folding region NFA1, the second non-folding region NFA2 and the folding region FA in FIGS. 1A and 1B.

The width of the bending region BA and the width (or length) of the second panel region AA2 that are parallel with the first direction DR1 may be less than the width (or length) of the first panel region AA1 parallel with the first direction DR1. In an embodiment of the display panel DP, a region with the shorter length in the first direction DR1 is more easily bendable than a region with the longer length in the first direction DR1. In such an embodiment, the bending region BA is more easily bendable than the first panel region AA1.

The display panel DP may include a plurality of pixels PX, a plurality of scan lines SL1 to SLm, a plurality of data lines DL1 to DLn, a plurality of light-emitting control lines ECL1 to ECLm, first and second control lines CSL1 and CSL2, a driving voltage line PL, and a plurality of pads PD. Here, m and n are natural numbers. The pixels PX may be connected to the scan lines SL1 to SLm, the data lines DL1 to DLn, and the light-emitting control lines ECL1 to ECLm.

The scan lines SL1 to SLm may extend in the first direction DR1 to be electrically connected to the scan driving unit SDV. The data lines DL1 to DLn may extend in the second direction DR2 and be electrically connected to the driving chip DIC via the bending region BA. The light-emitting control lines ECL1 to ECLm may extend in the first direction DR1 to be electrically connected to the light-emitting driving unit EDV.

The driving voltage line PL may include a portion extending in the first direction DR1 and a portion extending in the second direction DR2. The portion extending in the first direction DR1 and the portion extending in the second direction DR2 may be disposed on different layers. The portion, of the driving voltage line PL, extending in the second direction DR2 may extend to the second panel region AA2 via the bending region BA. The driving voltage line PL may supply a first voltage to the pixels PX.

The first control line CSL1 may be connected to the scan driving unit SDV and extend toward a lower end of the second panel region AA2 via the bending region BA. The second control line CSL2 may be connected to the light-emitting driving unit EDV and extend toward the lower end of the second panel region AA2 via the bending region BA.

When seen on a plane, the pads PD may be disposed adjacent to the lower end of the second panel region AA2. The driving chip DIC, the driving voltage line PL, the first control line CSL1 and the second control line CSL2 may be electrically connected to the pads PD. A flexible circuit film FCB may be electrically connected to the pads PD through an anisotropic conductive adhesive layer.

Figure 5:
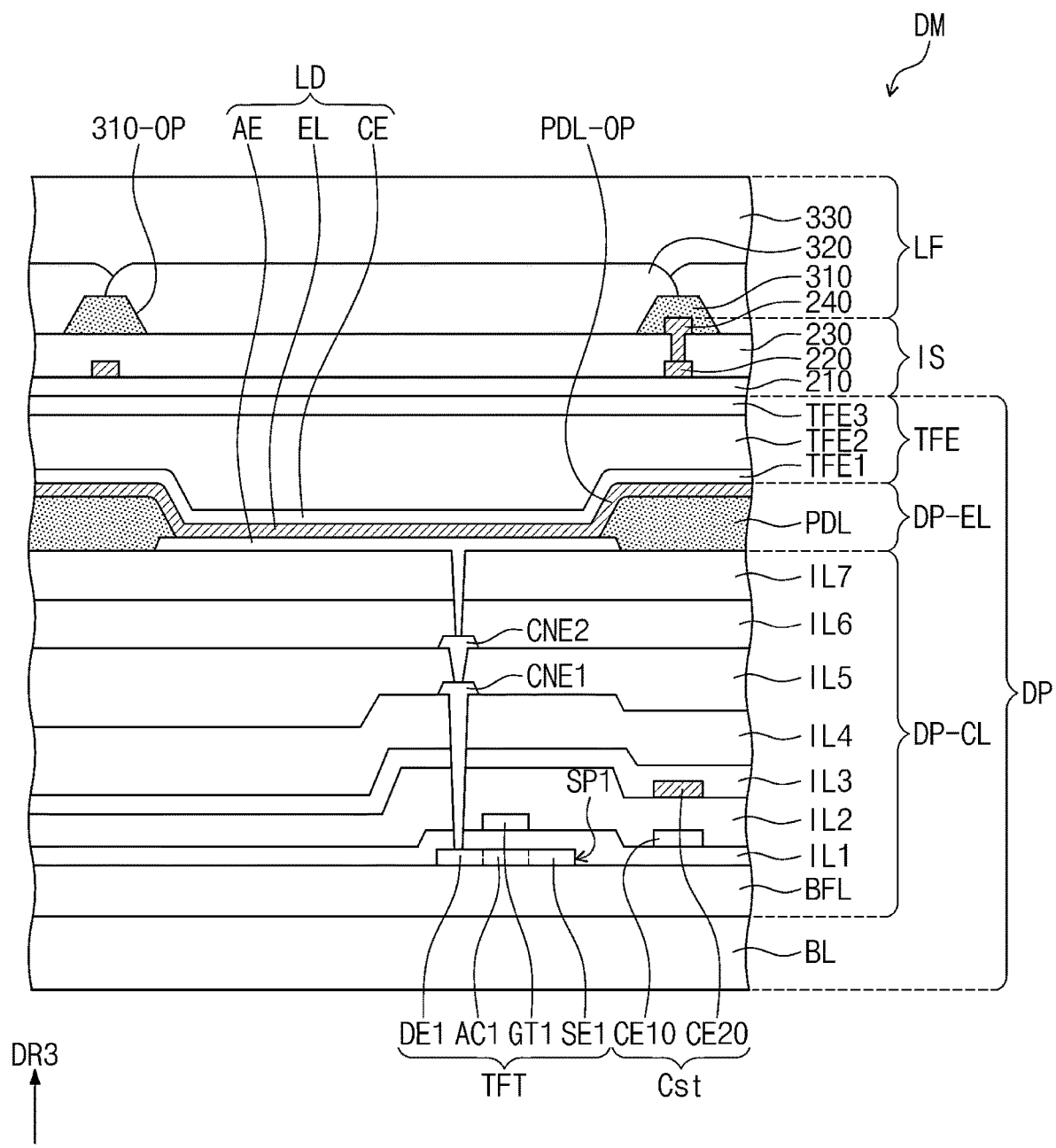
FIG. 5 is a cross-sectional view illustrating some components of a display module according to an embodiment of the invention.

FIG. 5 is a cross-sectional view illustrating some components of a display module DM according to an embodiment of the invention. FIG. 5 illustrates in more detail components corresponding to one pixel with respect to the display panel DP, the input sensor IS and the anti-reflective layer LF of the display module DM illustrated in FIG. 3.

FIG. 5 illustrates one light-emitting element LD and one transistor TFT. The transistor TFT may be a silicon transistor or an oxide transistor. The pixel may include a plurality of transistors, and one of the plurality of transistors may be an oxide transistor and the other transistors may be silicon transistors.

A buffer layer BFL may be disposed on a base layer BL. The buffer layer BFL may prevent metal atoms or impurities from diffusing from the base layer BL into a first semiconductor pattern SP1 thereabove. The first semiconductor pattern SP1 includes an active region AC1 of the transistor TFT. The buffer layer BFL may adjust the supply rate of heat during a crystallization process for forming the first semiconductor pattern SP1, and thus the first semiconductor pattern SP1 may be uniformly formed.

The first semiconductor pattern SP1 may be disposed on the buffer layer BFL. The first semiconductor pattern SP1 may include a silicon semiconductor. In an embodiment, for example, the silicon semiconductor may include amorphous silicon, polycrystalline silicon or the like. In an embodiment, for example, the first semiconductor pattern SP1 may include low-temperature polysilicon. Alternatively, the first semiconductor pattern SP1 may include an oxide semiconductor. The first semiconductor pattern SP1 may include a transparent conductive oxide ("TCO") such as indium tin oxide ("ITO"), indium zinc oxide ("IZO"), indium gallium zinc oxide ("IGZO"), zinc oxide (ZnO) or indium oxide ($In_2O_3$).

FIG. 5 merely illustrates a portion of the first semiconductor pattern SP1 disposed on the buffer layer BFL, and the first semiconductor pattern SP1 may thus be further disposed in another region. The first semiconductor pattern SP1 may be arranged over pixels based on a predetermined arrangement or pattern. The first semiconductor pattern SP1 may have different electrical properties based on whether the first semiconductor pattern SP1 is doped or not. The first semiconductor pattern SP1 may include a first region with high conductivity and a second region with low conductivity. The first region may be doped with an N-type dopant or P-type dopants. A P-type transistor may include a doped region doped with the P-type dopant, and an N-type transistor may include a doped region doped with the N-type dopant. The second region may be an undoped region or a doped region the doping concentration of which is lower than that of the first region.

The conductivity of the first region may be higher than the conductivity of the second region, and the first region may substantially serve as an electrode or a signal line. The second region may substantially correspond to an active region (or channel) of the transistor. That is, one portion of the first semiconductor pattern SP1 may be an active region of the transistor, another portion may be a source or drain of the transistor, and still another portion may be a connection electrode or a connection signal line.

A source region SE1 (or source), an active region AC1 (or channel), and a drain region DE1 (or drain) of the transistor TFT may be formed from (or defined by portions of) the first semiconductor pattern SP1. The source region SE1 and the drain region DE1 may extend from the active region AC1 in directions opposite to each other on a cross section.

A first insulation layer IL1 may be disposed on the buffer layer BFL. The first insulation layer IL1 may commonly overlap a plurality of pixels and cover the first semiconductor pattern SP1. The first insulation layer IL1 may be an inorganic layer and/or an organic layer, and have a single-layer or multilayer structure. The first insulation layer IL1 may include at least one selected from aluminum oxide, titanium oxide, silicon oxide, silicon nitride, silicon oxynitride, zirconium oxide and hafnium oxide. In an embodiment, the first insulation layer IL1 may be a single-layered silicon oxide layer. In addition to the first insulation layer IL1, an insulation layer of a circuit layer DP-CL to be described later may be an inorganic layer and/or an organic layer, and have a single-layer or multilayer structure. The inorganic layer may include at least one selected from the materials listed above, but is not limited thereto.

A gate GT1 of the transistor TFT is disposed on the first insulation layer IL1. The gate GT1 may be a portion of a metal pattern. The gate GT1 overlaps the active region AC1. The gate GT1 may function as a mask in a process for doping the first semiconductor pattern SP1. The gate GT1 may include titanium (Ti), silver (Ag), silver-containing alloy, molybdenum (Mo), molybdenum-containing alloy, aluminum (Al), aluminum-containing alloy, aluminum nitride (AlN), tungsten (W), tungsten nitride (WN), copper (Cu), ITO, IZO or the like, but is not particularly limited thereto.

A second insulation layer IL2 may be disposed on the first insulation layer IL1 and cover the gate GT1. A third insulation layer IL3 may be disposed on the second insulation layer IL2. A second electrode CE20 of a storage capacitor Cst may be disposed between the second insulation layer IL2 and the third insulation layer IL3. In addition, a first electrode CE10 of the storage capacitor Cst may be disposed between the first insulation layer IL1 and the second insulation layer IL2.

A fourth insulation layer IL4 may be disposed on the third insulation layer IL3. A first connection electrode CNE1 may be disposed on the fourth insulation layer IL4. The first connection electrode CNE1 may be connected to the drain region DE1 of the transistor TFT through a contact hole defined through the first to fourth insulation layers ILL IL2, IL3 and IL4.

A fifth insulation layer IL5 may be disposed on the fourth insulation layer IL4. A second connection electrode CNE2 may be disposed on the fifth insulation layer IL5. The second connection electrode CNE2 may be connected to the first connection electrode CNE1 through a contact hole defined through the fifth insulation layer IL5. A sixth insulation layer IL6 may be disposed on the fifth insulation layer IL5 and cover the second connection electrode CNE2. A seventh insulation layer IL7 may be disposed on the sixth insulation layer IL6.

Each of the fifth insulation layer IL5, the sixth insulation layer IL6 and the seventh insulation layer IL7 may be an organic layer. In an embodiment, for example, each of the fifth insulation layer IL5, the sixth insulation layer IL6 and the seventh insulation layer IL7 may include benzocyclobutene ("BCB"), polyimide, hexamethyldisiloxane ("HMDSO"), general purpose polymer such as polymethyl methacrylate ("PMMA") or polystyrene ("PS"), polymer derivative having a phenol-based group, acryl-based polymer, imide-based polymer, acryl ether-based polymer, amide-based polymer, fluorine-based polymer, p-xylene-based polymer, vinyl alcohol-based polymer, or a blend thereof, etc.

A light-emitting element LD may include a first electrode AE, a light-emitting layer EL and a second electrode CE. The second electrode CE may be provided, in common, on a plurality of light-emitting elements.

The first electrode AE of the light-emitting element LD may be disposed on the seventh insulation layer IL7. The first electrode AE of the light-emitting element LD may be a (semi-)transparent electrode a reflective electrode. According to an embodiment of the invention, the first electrode AE of the light-emitting element LD may include a reflective layer including or formed of Ag, Mg, Al, Pt, Pd, Au, Ni, Nd, Ir, Cr, or a compound thereof, etc., and a transparent or semi-transparent electrode layer disposed or formed on the reflective layer. The transparent or semi-transparent electrode layer may include at least one selected from ITO, IZO, IGZO, zinc oxide (ZnO) or indium oxide ($In_2O_3$), or aluminum-doped zinc oxide ("AZO"). In an embodiment, for example, the first electrode AE of the light-emitting element LD may include a stacked structure of ITO/Ag/ITO.

A pixel defining film PDL may be disposed on the seventh insulation layer IL7. The pixel defining film PDL may have a light absorbing property, and the pixel defining film PDL may have, for example, a black color. The pixel defining film PDL may include a black coloring agent. The black coloring agent may include a black dye or a black pigment. The black coloring agent may include a carbon black, a metal such as chrome, or an oxide thereof. The pixel defining film PDL may correspond to a light-shielding pattern having light-shielding properties.

The pixel defining film PDL may cover a portion of the first electrode AE of the light-emitting element LD. In an embodiment, for example, in the pixel defining film PDL, an opening PDL-OP may be defined which exposes a portion of the first electrode AE of the light-emitting element LD. The pixel defining film PDL may increase a distance between an edge of the first electrode AE of the light-emitting element LD and the second electrode CE. Thus, the pixel defining film PDL may play a role in preventing an arc or the like from occurring at the edge of the first electrode AE.

Although not illustrated, a hole control layer may be disposed between the first electrode AE and the light-emitting layer EL. The hole control layer may include a hole transport layer. The hole control layer may further include a hole injection layer between the hole transport layer and the first electrode AE. An electron control layer may be disposed between the light-emitting layer EL and the second electrode CE. The electron control layer may include an electron transport layer. The electron control layer may further include an electron injection layer between the electron transport layer and the second electrode CE. The hole control layer and the electron control layer may be formed, in common, in the plurality of pixels PX (see FIG. 4) using an open mask.

An encapsulation layer TFE may be disposed on a light-emitting element layer DP-EL. The encapsulation layer TFE may include an inorganic layer TFE1, an organic layer TFE2 and an inorganic layer TFE3 which are stacked in sequence, but layers constituting the encapsulation layer TFE are not limited thereto.

The inorganic layers TFE1 and TFE3 may protect the light-emitting element layer DP-EL from moisture and oxygen, and the organic layer TFE2 may protect the light-emitting element layer DP-EL from a foreign matter such as dust particles. The inorganic layers TFE1 and TFE3 may include a silicon nitride layer, a silicon oxynitride layer, a silicon oxide layer, a titanium oxide layer, an aluminum oxide layer or the like. The organic layer TFE2 may include an acrylic organic layer, and is not limited thereto.

An input sensor IS may be disposed on a display panel DP. The input sensor IS may be referred to as a sensor, an input sensing layer or an input sensing panel. The input sensor IS may include a sensor base layer 210, a first conductive layer 220, a sensing insulation layer 230 and a second conductive layer 240.

The sensor base layer 210 may be disposed directly on the display panel DP. The sensor base layer 210 may be an inorganic layer including at least one selected from silicon nitride, silicon oxynitride and silicon oxide. Alternatively, the sensor base layer 210 may be an organic layer including an epoxy resin, an acrylic resin or an imide-based resin. The sensor base layer 210 may have a single-layer structure or have a multilayer structure in which layers are stacked along the third direction DR3.

Each of the first conductive layer 220 and the second conductive layer 240 may have a single-layer structure or a multilayer structure in which layers are stacked along the third direction DR3. The first conductive layer 220 and the second conductive layer 240 may include conductive lines that define a mesh-shaped sensing electrode. The conductive lines may not overlap the opening PDL-OP and may overlap the pixel defining film PDL.

The conductive layer having a single-layer structure may include a metal layer or a transparent conductive layer. The metal layer may include molybdenum, chrome, nickel, silver, titanium, copper, aluminum or an alloy thereof. The transparent conductive layer may include a transparent conductive oxide such as ITO, IZO, zinc oxide (ZnO) or indium zinc tin oxide ("IZTO"). In addition, the transparent conductive layer may include a conductive polymer such as PEDOT, metal nanowire, graphene or the like.

The conductive layer having a multilayer structure may include metal layers stacked in sequence. The metal layers may have a three-layer structure of, for example, titanium/aluminum/titanium. The conductive layer having a multilayer structure may include at least one metal layer and at least one transparent conductive layer.

The sensing insulation layer 230 may be disposed between the first conductive layer 220 and the second conductive layer 240. The sensing insulation layer 230 may include an inorganic film. The inorganic film may include at least one selected from aluminum oxide, titanium oxide, silicon oxide, silicon nitride, silicon oxynitride, zirconium oxide and hafnium oxide.

Alternatively, the sensing insulation layer 230 may include an organic film. The organic film may include at least one selected from acryl-based resin, methacryl-based resin, polyisoprene, vinyl-based resin, epoxy-based resin, urethane-based resin, cellulose-based resin, siloxane-based resin, polyimide-based resin, polyamide-based resin and perylene-based resin.

An anti-reflective layer LF may be disposed on the input sensor IS. The anti-reflective layer LF may include a division layer 310, a plurality of color filters 320 and a planarization layer 330.

A material constituting the division layer 310 is not particularly limited as long as being a material that absorbs light. The division layer 310 is a layer having a black color, and in an embodiment, the division layer 310 may include a black coloring agent. The black coloring agent may include a black dye or a black pigment. The black coloring agent may include a carbon black, a metal such as chrome, or an oxide thereof.

The division layer 310 may cover the second conductive layer 240 of the input sensor IS. The division layer 310 may prevent external light from being reflected by the second conductive layer 240. The division layer 310 may be omitted in some regions of the display module DM. A region in which the division layer 310 is omitted and not disposed may have a higher transmittance than other regions.

An opening 310-OP may be defined in the division layer 310. The opening 310-OP may overlap the first electrode AE of the light-emitting element LD. One of the plurality of color filters 320 may overlap the first electrode AE of the light-emitting element LD. One of the plurality of color filters 320 may cover the opening 310-OP. The plurality of color filters 320 may each be in contact with the division layer 310.

The planarization layer 330 may cover the division layer 310 and the plurality of color filters 320. The planarization layer 330 may include an organic matter and an upper surface of the planarization layer 330 may be provided as a flat surface. In an alternative embodiment of the invention, the planarization layer 330 may be omitted.

Figure 6:
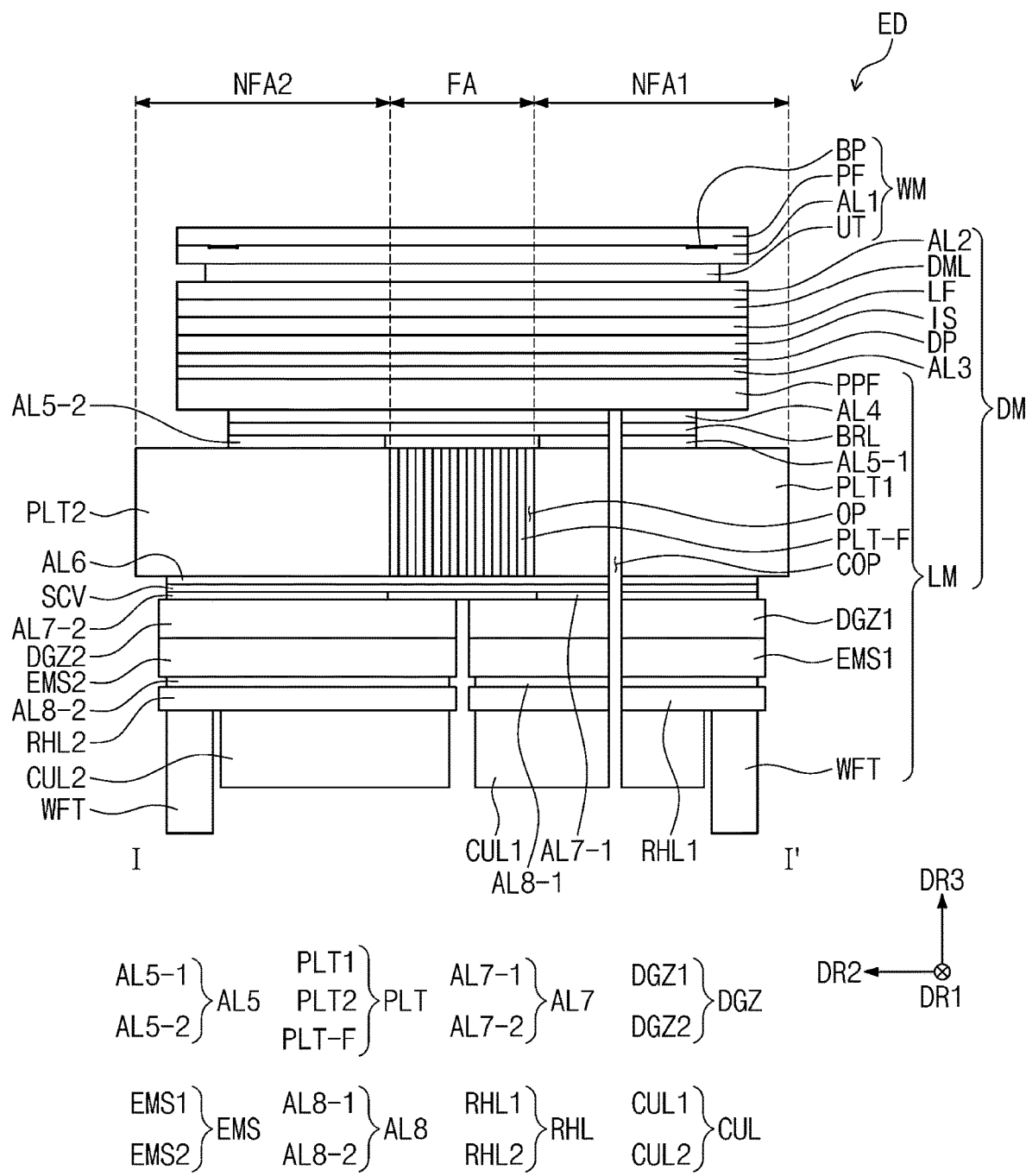
FIG. 6 is a cross-sectional view of an electronic device according to an embodiment of the invention.

FIG. 6 is a cross-sectional view of an electronic device ED according to an embodiment of the invention and taken along line I-I' in FIG. 2A. FIG. 6 illustrates in more detail the window module WM and the display module DM among components of the electronic device ED illustrated in FIG. 2A, and the flexible circuit film FCB, the first electronic module EM1, the second electronic module EM2, and the housing EDC1 and EDC2 are not illustrated therein for convenience of illustration.

Referring to FIG. 6, an embodiment of an electronic device ED may include a window module WM and a display module DM.

The window module WM may include a window UT, a protective film PF disposed on the window UT, and a bezel pattern BP.

The window UT may be a chemically strengthened glass. Since the window UT is applied to the electronic device ED, the occurrence of wrinkles on the surface of the electronic device ED may be minimized even when folding and unfolding of the electronic device ED are repeated.

The protective film PF may include polyimide, polycarbonate, polyamide, triacetylcellulose, polymethylmethacrylate or polyethylene terephthalate. Although not separately illustrated, at least one selected from a hard coating layer, an anti-fingerprint layer and an anti-reflective layer may be disposed on the upper surface of the protective film PF.

The bezel pattern BP overlaps the non-display region NDA illustrated in FIG. 1A. The bezel pattern BP may be disposed on one surface of the window UT or one surface of the protective film PF. FIG. 6 illustrates an embodiment where the bezel pattern BP is disposed on a lower surface of the protective film PF. An embodiment of the invention is not limited thereto, and alternatively, the bezel pattern BP may be disposed on an upper surface of the protective film PF, an upper surface of the window UT, or a lower surface of the window UT. The bezel pattern BP may be formed as a colored light-shielding film, for example, through a coating process. The bezel pattern BP may include a base material and a dye or pigment mixed with the base material. The bezel pattern BP may have a closed line shape on a plane.

A first adhesive layer AL1 may be disposed between the protective film PF and the window UT. The first adhesive layer AL1 may be a pressure sensitive adhesive film ("PSA") or an optically clear adhesive ("OCA"). Adhesive layers to be described hereinbelow may be the same as the first adhesive layer AL1, and include a typical or commercially available adhesive.

The first adhesive layer AL1 may have a thickness with which the bezel pattern BP is covered. In an embodiment, for example, the bezel pattern BP may have a thickness of about 3 micrometers (μm) to about 8 μm, and the first adhesive layer AL1 may have a thickness with which air bubbles do not occur on the periphery of the bezel pattern BP.

The first adhesive layer AL1 may be detached from the window UT. The protective film PF has lower strength than the window UT and thus, a scratch may relatively easily occur in the protective film PF. After the first adhesive layer AL1 and the damaged protective film PF are detached from the window UT, a new protective film PF may be attached to the window UT.

The display module DM may include an impact absorption layer DML, a display panel DP and a lower member LM. An input sensor IS and an anti-reflective layer LF may be disposed between the impact absorption layer DML and the display panel DP. The input sensor IS may be disposed directly on the display panel DP, and the anti-reflective layer LF may be disposed directly on the input sensor IS.

The impact absorption layer DML may be disposed on the display panel DP. The impact absorption layer DML may be a functional layer for protecting the display panel DP from an external impact. The impact absorption layer DML may be bonded to the window UT through a second adhesive layer AL2. The impact absorption layer DML may be disposed directly on the anti-reflective layer LF. However, an embodiment of the invention is not limited thereto, and alternatively, an adhesive layer may be disposed between the impact absorption layer DML and the anti-reflective layer LF.

The lower member LM may be disposed below the display panel DP. The lower member LM may be bonded to the display panel DP through a third adhesive layer AL3. The lower member LM may include a panel protective layer PPF, a barrier layer BRL, a support layer PLT, a cover layer SCV, a digitizer DGZ, an electromagnetic shielding layer EMS, a lower plate RHL, a cushion layer CUL, and a waterproof tape WFT. In an alternative embodiment of the invention, the lower member LM may not include some of the components listed above, or may further include other components. In addition, the stacking order illustrated in FIG. 6 merely shows a stacking order of one embodiment, and thus, in alternative embodiments, the respective components may be stacked in a different order.

The panel protective layer PPF may be disposed below the display panel DP. The third adhesive layer AL3 may bond the panel protective layer PPF and the display panel DP. The panel protective layer PPF may protect a lower portion of the display panel DP. The panel protective layer PPF may include a flexible plastic material. The panel protective layer PPF may prevent a scratch from occurring on a rear surface of the display panel DP during a manufacturing process of the display panel DP. The panel protective layer PPF may be a colored polyimide film. In an embodiment, for example, the panel protective layer PPF may be an opaque yellow film, but is not limited thereto.

The barrier layer BRL may be disposed below the panel protective layer PPF. A fourth adhesive layer AL4 may be disposed between the panel protective layer PPF and the barrier layer BRL to bond the barrier layer BRL to the panel protective layer PPF. The barrier layer BRL may increase resistance to a compressive force caused by external pressure. Thus, the barrier layer BRL may play a role in preventing deformation of the display panel DP. The barrier layer BRL may include a flexible plastic material such as polyimide or polyethylene terephthalate.

In an embodiment, the barrier layer BRL may absorb light incident from the outside. The barrier layer BRL may include a light-shielding material or be a colored film having a low light transmittance. In an embodiment, for example, the barrier layer BRL may be a black plastic film, and may be, for example, a black polyimide film. As the display module DM is seen from above the window module WM, components disposed below the barrier layer BRL may be invisible to a user.

The support layer PLT is disposed below the display panel DP. In an embodiment, the support layer PLT may be disposed below the barrier layer BRL. The support layer PLT supports components disposed above the support layer PLT and maintains an unfolding state and a folding state of the electronic device ED. In an embodiment of the invention, the support layer PLT may include a first support portion PLT1 corresponding to the first non-folding region NFA1, a second support portion PLT2 corresponding to the second non-folding region NFA2, and a folding portion PLT-F corresponding to the folding region FA. The first support portion PLT1 and the second support portion PLT2 may be spaced apart from each other in the second direction DR2. The folding portion PLT-F may be disposed between the first support portion PLT1 and the second support portion PLT2, and a plurality of opening portions OP may be defined in the folding portion PLT-F. Due to the plurality of opening portions OP, the flexibility of one portion of the support layer PLT may be improved. Due to the plurality of opening portions OP, the flexibility of a portion, of the support layer PLT, overlapping the folding region FA may be improved. However, an embodiment of the invention is not limited thereto, and in an alternative embodiment of the invention, the support layer PLT may not include the folding portion PLT-F, unlike the embodiment in FIG. 6.

The first support portion PLT1 and the second support portion PLT2 may each include a material which allows a magnetic field, generated from a digitizer DGZ to be described later, to pass therethrough without loss or with minimum loss. Each of the first support portion PLT1 and the second support portion PLT2 may include a non-metal material. Each of the first support portion PLT1 and the second support portion PLT2 may include a fiber-reinforced plastic (FRP).

In an embodiment of the invention, the support layer PLT may include a fiber-reinforced plastic. Each of the first support portion PLT1 and the second support portion PLT2 of the support layer PLT may include a fiber-reinforced plastic. In an embodiment, each of the first support portion PLT1 and the second support portion PLT2 may include a reinforcement fiber containing an aramid fiber or containing at least two selected from an aramid fiber, a carbon fiber and a glass fiber. In an embodiment, for example, each of the first support portion PLT1 and the second support portion PLT2 may include a reinforcement fiber containing an aramid fiber, or may include a reinforcement fiber containing a carbon fiber and a glass fiber. Since the first support portion PLT1 and the second support portion PLT2 that constitute the support layer PLT each include a fiber-reinforced plastic, the thickness thereof may be easily adjusted. That is, the thickness of the support layer PLT including the fiber-reinforced plastic may be more easily adjusted than in a case where the support layer includes or is formed of a metal material.

The first support portion PLT1 and the second support portion PLT2 of the support layer PLT may include a same material as each other. The folding portion PLT-F of the support layer PLT may include a material same as or different from those of the first support portion PLT1 and the second support portion PLT2. The folding portion PLT-F may include the fiber-reinforced plastic like the first support portion PLT1 and the second support portion PLT2. In an embodiment, for example, the folding portion PLT-F may also include a reinforcement fiber containing an aramid fiber or containing at least two selected from an aramid fiber, a carbon fiber and a glass fiber. Alternatively, the folding portion PLT-F may include a material having an elastic modulus of about 60 gigapascals (Gpa) or greater, or may include a metal material such as stainless steel. In an embodiment, for example, the folding portion PLT-F may include a stainless steel (e.g., SUS 304), but is not limited thereto. The folding portion PLT-F may include various metal materials.

The thickness of the support layer PLT may be changed in light of the device design characteristics of the electronic device ED, the mechanical properties of the electronic device ED, or the like. In an embodiment, for example, the thickness of the support layer PLT may be about 50 μm to about 500 μm. In an embodiment, the thickness of the support layer PLT may be about 100 μm to about 300 μm. However, an embodiment of the invention is not limited thereto.

A fifth adhesive layer AL5 may be disposed between the barrier layer BRL and the support layer PLT. The fifth adhesive layer AL5 may bond the barrier layer BRL and the support layer PLT to each other. On a plane, the fifth adhesive layer AL5 may not overlap the plurality of opening portions OP. In addition, on a plane, the fifth adhesive layer AL5 may be spaced apart from the plurality of opening portions OP.

The fifth adhesive layer AL5 may include a first portion AL5-1 and a second portion AL5-2 which are spaced apart from each other. The first portion AL5-1 and the second portion AL5-2 may be spaced apart with the plurality of opening portions OP therebetween. The first portion AL5-1 may overlap the first non-folding region NFA1, the second portion AL5-2 may overlap the second non-folding region NFA2, and each of the first portion AL5-1 and the second portion AL5-2 may not overlap the folding region FA. Since the fifth adhesive layer AL5 is not be disposed in a region corresponding to the folding region FA, the flexibility of the support layer PLT may be improved.

In a region overlapping the folding region FA, the barrier layer BRL may be spaced apart from the support layer PLT. That is, in a portion overlapping the folding region FA, an empty space may be defined between the support layer PLT and the barrier layer BRL.

Since the empty space is defined between the barrier layer BRL and the support layer PLT when the electronic device ED (see FIG. 1A) is folded, the plurality of opening portions OP defined in the support layer PLT may be invisible outside the electronic device ED (see FIG. 1A).

In addition, since the barrier layer BRL includes a light-shielding material or employs a colored film having a low light transmittance, a color difference of the support layer PLT may be invisible externally. In an embodiment, for example, in the support layer PLT, a color difference between a first support region having a plurality of opening portions OP defined therein and a second support region not having a plurality of opening portions OP defined therein may be invisible externally. The first support region may be a region overlapping the folding region FA, and the second support region may be a region overlapping the first non-folding region NFA1 and the second non-folding region NFA2.

The fifth adhesive layer AL5-1 and AL5-2 may have a thickness smaller than that of the fourth adhesive layer AL4. In an embodiment, for example, the thickness of the fourth adhesive layer AL4 may be about 25 μm, and the thickness of fifth adhesive layer AL5-1 and AL5-2 may be about 16 μm.

A sixth adhesive layer AL6 may be disposed below the support layer PLT, and the cover layer SCV may be disposed below the sixth adhesive layer AL6. The support layer PLT and the cover layer SCV may be bonded by the sixth adhesive layer AL6. The cover layer SCV may be manufactured in a sheet form and attached to the support layer PLT.

The sixth adhesive layer AL6 and the cover layer SCV may cover the plurality of opening portions OP defined in the support layer PLT. Thus, the cover layer SCV may prevent introduction of foreign matter into the plurality of opening portions OP. The cover layer SCV may have a lower elastic modulus than the support layer PLT. In an embodiment, for example, the cover layer SCV may include thermoplastic polyurethane, rubber or silicone, but is not limited thereto.

A seventh adhesive layer AL7 may be disposed below the cover layer SCV. The seventh adhesive layer AL7 may include a first portion AL7-1 and a second portion AL7-2. The first portion AL7-1 and the second portion AL7-2 may be spaced apart from each other. On a plane, the first portion AL7-1 and the second portion AL7-2 may be spaced apart with the plurality of opening portions OP therebetween. The first portion AL7-1 and the second portion AL7-2 may not overlap the folding region FA.

The digitizer DGZ may include a first digitizer DGZ1 disposed below the first portion AL7-1 of the seventh adhesive layer AL7, and a second digitizer DGZ2 disposed below the second portion AL7-2 of the seventh adhesive layer AL7. The first digitizer DGZ1 may be attached to the first portion AL7-1, and the second digitizer DGZ2 may be attached to the second portion AL7-2. The first digitizer DGZ1 and the second digitizer DGZ2 are arranged apart from each other with a predetermined gap therebetween. The gap may be defined to correspond to the folding region FA. On a plane, a portion of the first digitizer DGZ1 may overlap a portion of the plurality of opening portions OP, and a portion of the second digitizer DGZ2 may overlap another portion of the plurality of opening portions OP.

Each of the first and second digitizers DGZ1 and DGZ2 may include multiple loop coils which generate a magnetic field of a preset resonant frequency with an electronic pen. The first and second digitizers DGZ1 and DGZ2 may be referred to as electro-magnetic resonance ("EMR") sensing panels.

The magnetic field generated by the first digitizer DGZ1 and the second digitizer DGZ2 is applied to an LC resonance circuit, of the pen, including an inductor (coil) and a capacitor. The coil generates a current by the received magnetic field, and delivers the generated current to the capacitor. Accordingly, the capacitor charges the current input from the coil, and discharges the charged current to the coil. As a result, the magnetic field of the resonant frequency is emitted from the coil. The magnetic field emitted from the pen may be re-absorbed by the loop coils of the digitizer and accordingly, it may be determined which portion of each of the first digitizer DGZ1 and the second digitizer DGZ2 the pen is close to.

The electromagnetic shielding layer EMS may be disposed below the digitizer DGZ. The electromagnetic shielding layer EMS may be added in order to block electromagnetic waves, generated from the first electronic module EM1 illustrated in FIG. 2A, from affecting the digitizer DGZ as noise. The electromagnetic shielding layer EMS may include a first electromagnetic shielding layer EMS1 and a second electromagnetic shielding layer EMS2 which respectively correspond to the first digitizer DGZ1 and the second digitizer DGZ2. In an embodiment, the electromagnetic shielding layer EMS may include a magnetic metal powder ("MMP") layer. The magnetic metal powder layer may be provided or formed directly on a lower surface of the digitizer DGZ through coating and curing processes. In an alternative embodiment of the invention, the electromagnetic shielding layer EMS may be omitted.

An eighth adhesive layer AL8 may be disposed below the first electromagnetic shielding layer EMS1 and the second electromagnetic shielding layer EMS2. The eighth adhesive layer AL8 may include a first portion AL8-1 and a second portion AL8-2. The first portion AL8-1 and the second portion AL8-2 may be spaced apart from each other.

The lower plate RHL may include a first lower plate RHL1 disposed below the first portion AL8-1 of the eighth adhesive layer AL8, and a second lower plate RHL2 disposed below the second portion AL8-2 of the eighth adhesive layer AL8. The first lower plate RHL1 and the second lower plate RHL2 may protect, from external pressure, components above the first lower plate RHL1 and the second lower plate RHL2. The first lower plate RHL1 and the second lower plate RHL2 may include SUS 316, but is not particularly limited thereto.

The cushion layer CUL may include a first cushion layer CUL1 disposed below the first lower plate RHL1, and a second cushion layer CUL2 disposed below the second lower plate RHL2. The first cushion layer CUL1 and the second cushion layer CUL2 may absorb an external impact to protect the display panel DP. Each of the first cushion layer CUL1 and the second cushion layer CUL2 may include a foam sheet having a predetermined elasticity. Each of the first cushion layer CUL1 and the second cushion layer CUL2 may include sponge or polyurethane.

The waterproof tape WFT may be attached to the first lower plate RHL1 and the second lower plate RHL2. In an embodiment, for example, the waterproof tape WFT may be disposed outside the first cushion layer CUL1 and the second cushion layer CUL2. The waterproof tape WFT may be attached to a set bracket (not illustrated). The thickness of the waterproof tape WFT may be greater than the thickness of each of the first cushion layer CUL1 and the second cushion layer CUL2. Even when the electronic device ED (see FIG. 2A) is immersed in water, the waterproof tape WFT may reduce a risk of the driving chip DIC (see FIG. 2A), etc. being immersed in water.

A through-hole COP may be defined in at least some components constituting the lower member LM. The through-hole COP may overlap with or correspond to the sensing region ED-SA (see FIG. 1A) of the electronic device ED. At least one portion of the camera module CMM (see FIG. 2A) may be inserted into the through-hole COP.

Figure 7A:
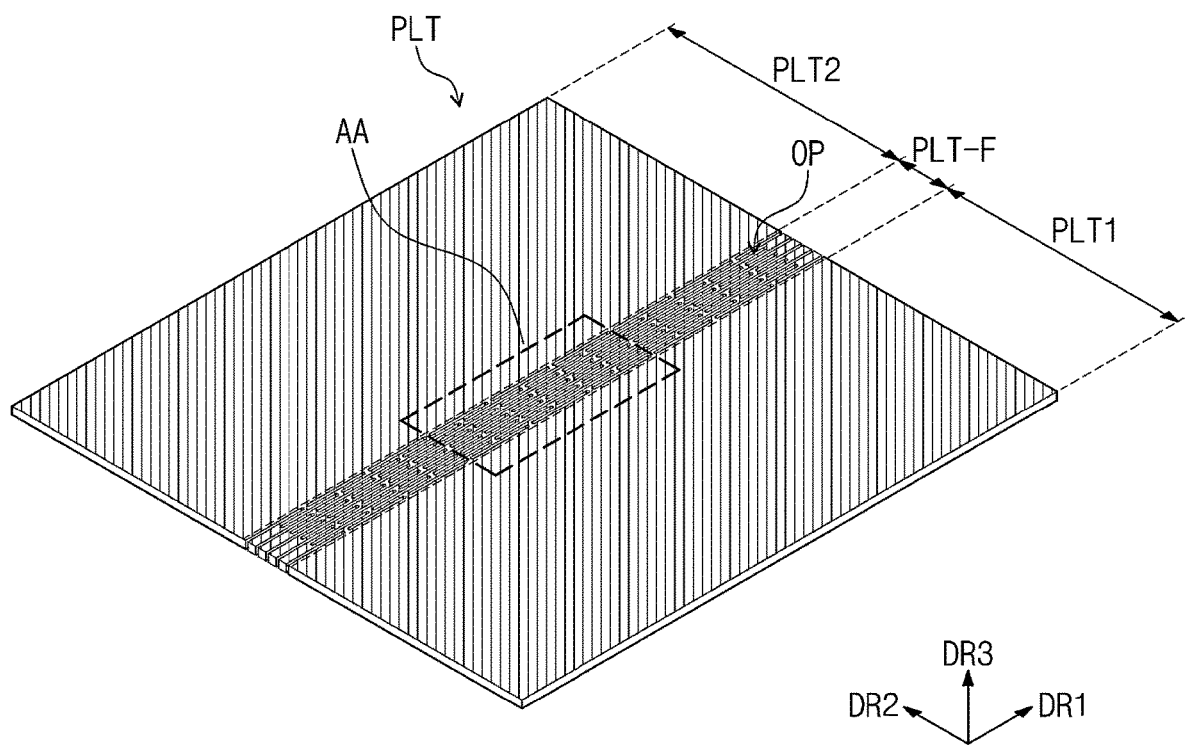
FIG. 7A is a perspective view of a support layer according to an embodiment of the invention.
Figure 7B:
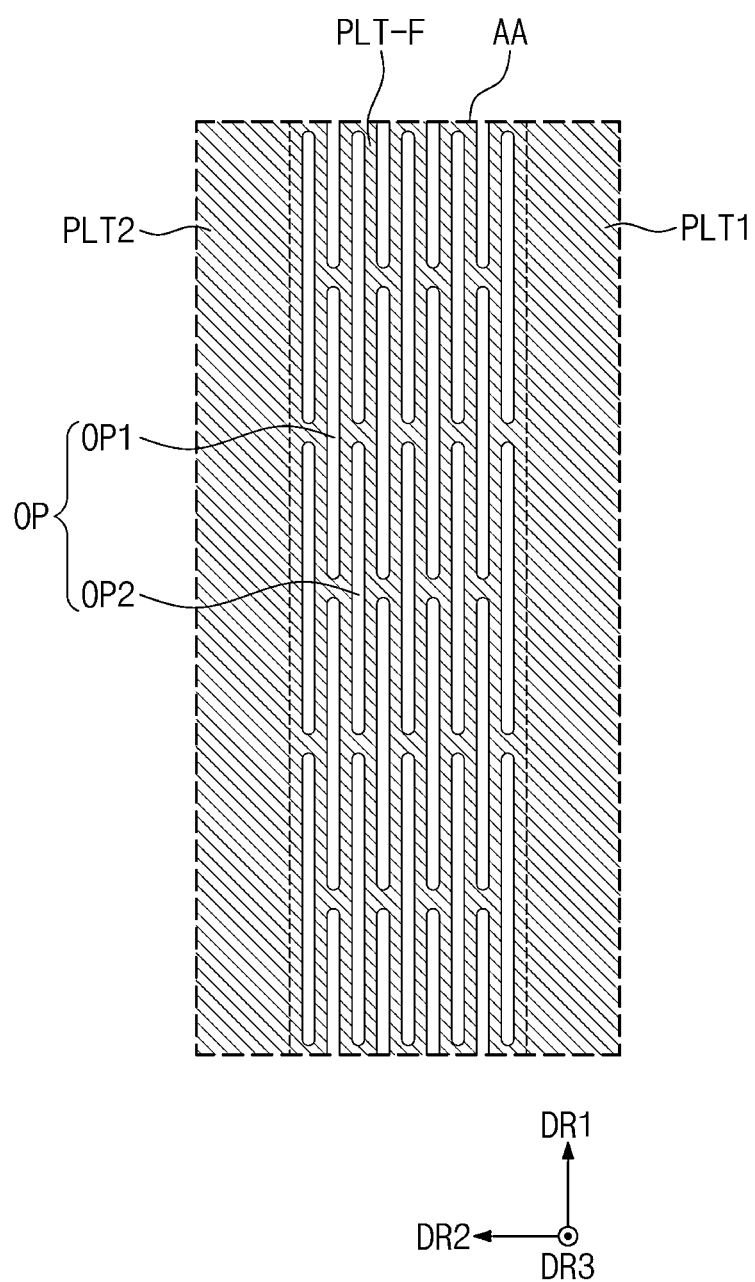
FIG. 7B is a partial plan view of a support layer according to an embodiment of the invention.
Figure 7C:
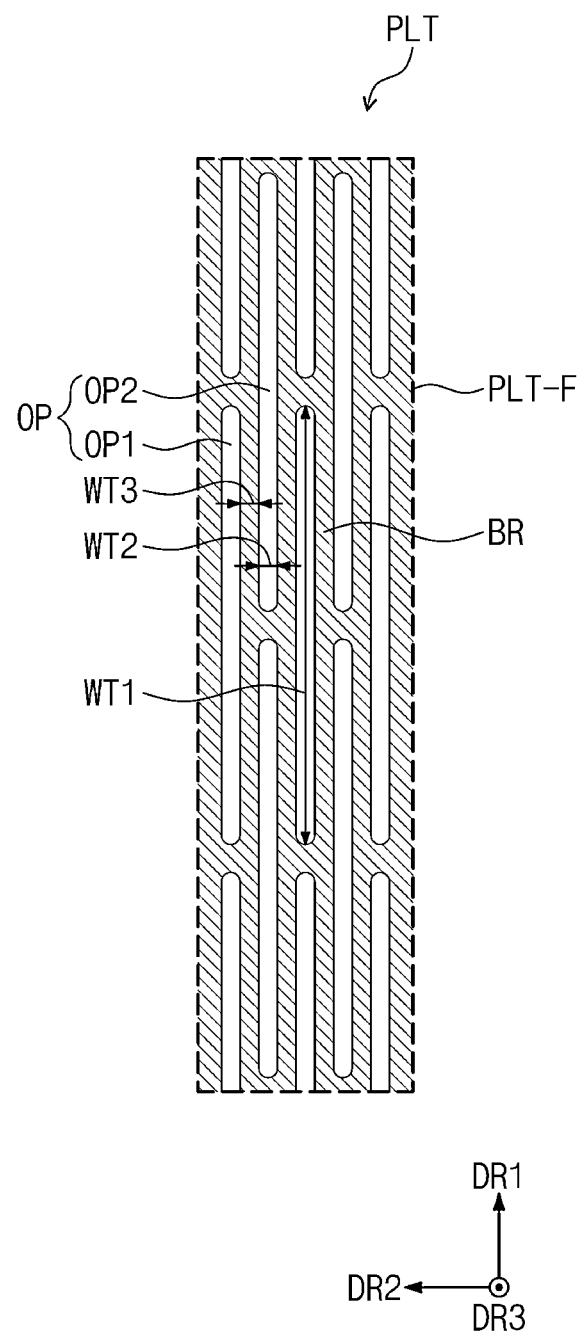
FIG. 7C is an enlarged view of some opening portions illustrated in FIG. 7B.
Figure 7D:
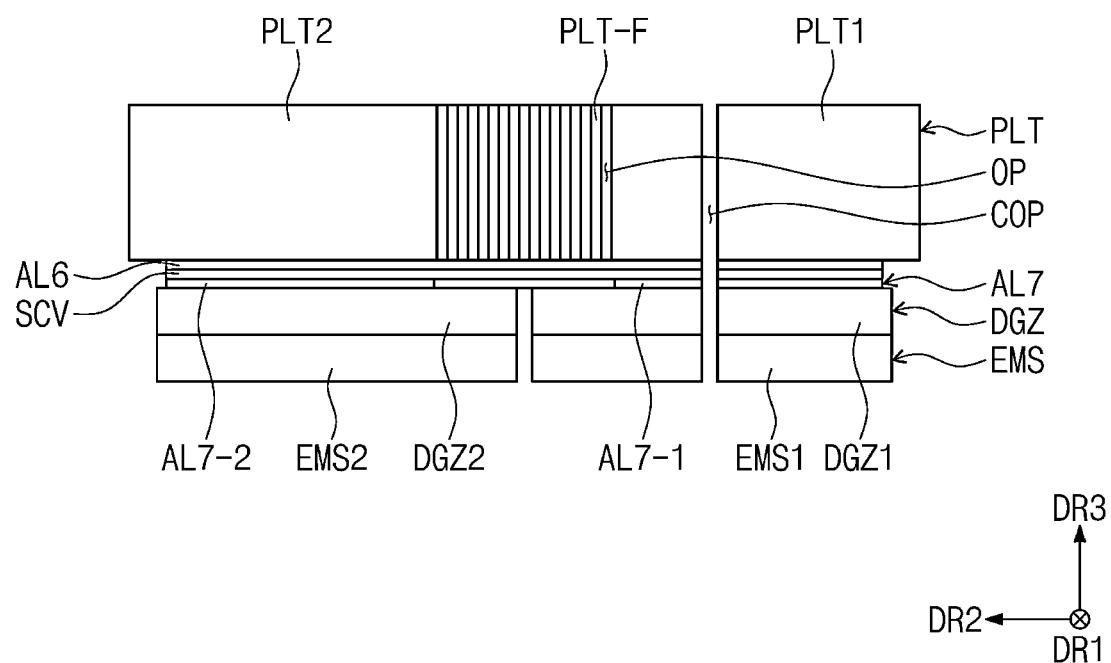
FIG. 7D is a partial cross-sectional view of an electronic device according to an embodiment of the invention.
Figure 7E:
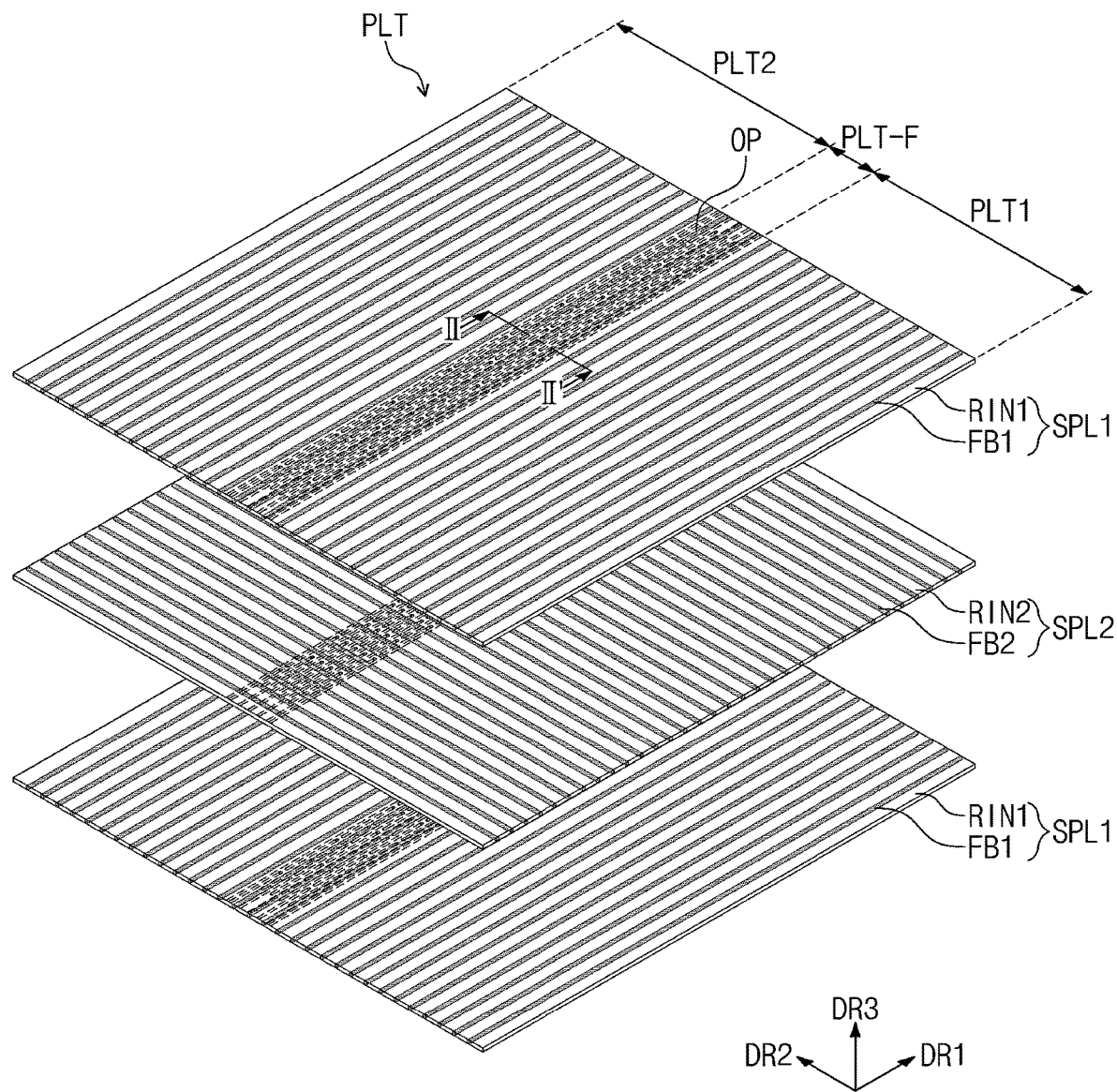
FIG. 7E is an exploded perspective view of a support layer according to an embodiment of the invention.
Figure 7F:
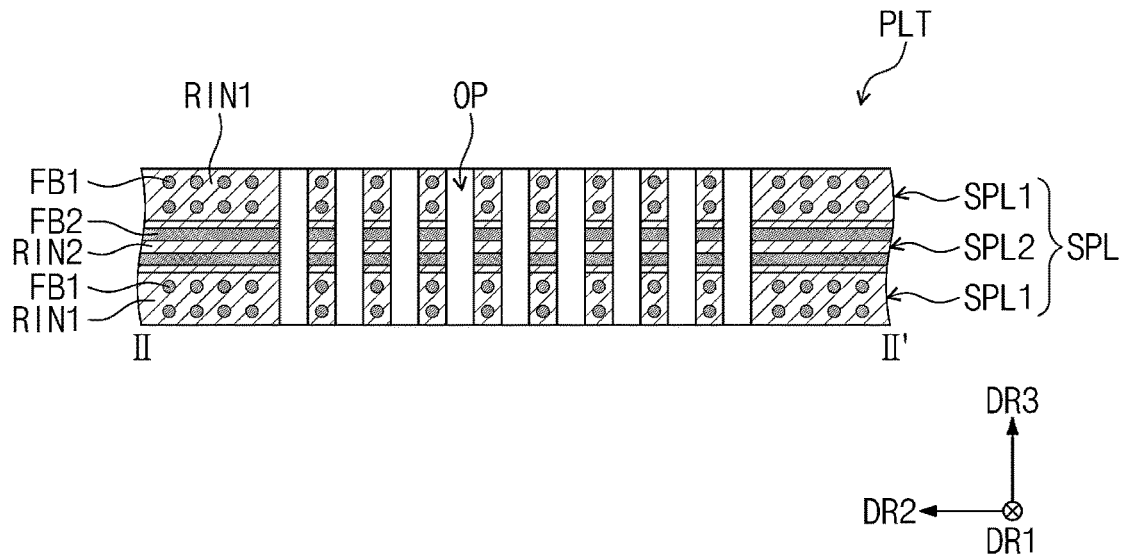
FIG. 7F is a partial cross-sectional view of a support layer according to an embodiment of the invention.
Figure 7G:
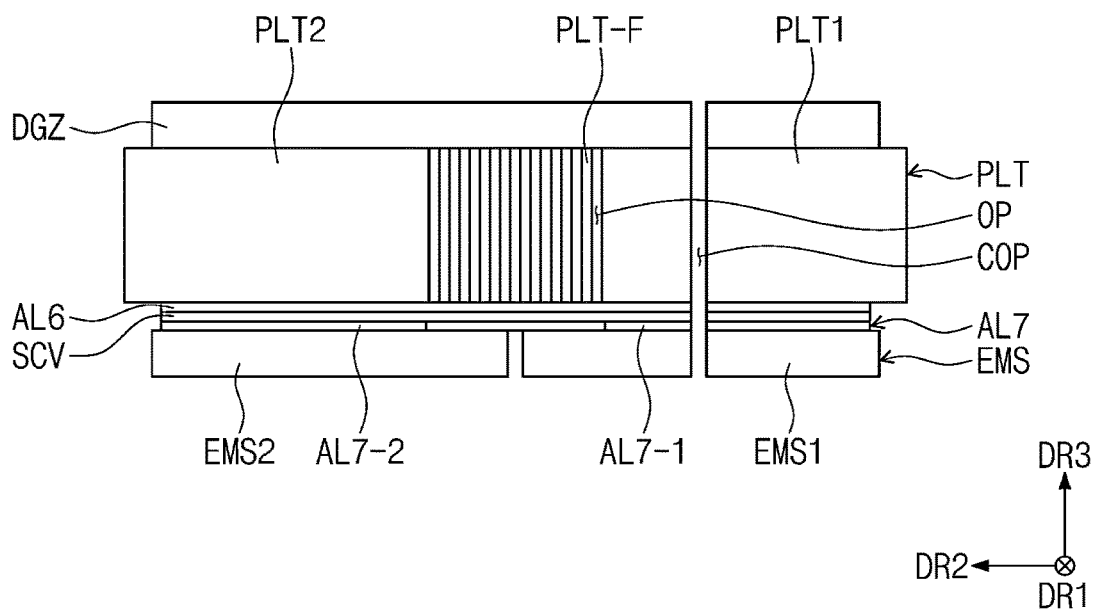
FIG. 7G is a partial cross-sectional view of an electronic device according to an embodiment of the invention.

FIG. 7A is a perspective view of a support layer PLT according to an embodiment of the invention. FIG. 7B is a partial plan view of a support layer PLT according to an embodiment of the invention. FIG. 7C is an enlarged view of some of opening portions OP illustrated in FIG. 7B. FIG. 7D is a partial cross-sectional view of an electronic device ED according to an embodiment of the invention. FIG. 7E is an exploded perspective view of a support layer PLT according to an embodiment of the invention. FIG. 7F is a partial cross-sectional view of a support layer PLT according to an embodiment of the invention. FIG. 7F illustrates a cross-sectional view of a support layer PLT taken along line II-IP in FIG. 7E. FIG. 7G is a partial cross-sectional view of an electronic device ED according to an embodiment of the invention.

In describing a support layer PLT according to an embodiment of the invention with reference to FIGS. 7A to 7G, the same or like components as those previously described with reference to FIG. 6 are labeled as the same or like reference numbers or symbols, and any repetitive detailed description thereof will hereinafter be omitted or simplified. FIGS. 7A and 7G illustrate only some components of the lower member LM disposed below the display panel DP, among the components of the electronic device ED illustrated in FIG. 6.

Referring to FIGS. 7A to 7D, a lower member of an electronic device according to an embodiment may include an electromagnetic shielding layer EMS, a digitizer DGZ disposed on the electromagnetic shielding layer EMS, a cover layer SCV disposed on the digitizer DGZ, and a support layer PLT disposed on the cover layer SCV. A sixth adhesive layer AL6 may attach the support layer PLT and the cover layer SCV to each other, and a seventh adhesive layer AL7 may attach the cover layer SCV and the digitizer DGZ to each other.

Referring to FIG. 7A, in an embodiment, the support layer PLT included in the electronic device may include a first support portion PLT1, a folding portion PLT-F and a second support portion PLT2 which are arranged sequentially along the second direction DR2. The folding portion PLT-F may be disposed between the first support portion PLT1 and the second support portion PLT2. The folding portion PLT-F may overlap the folding region FA (see FIG. 1A) of the electronic device ED (see FIG. 1A). At least one portion of the first support portion PLT1 of the support layer PLT may overlap the first non-folding region NFA1 (see FIG. 1A) of the electronic device ED (see FIG. 1A), and at least one portion of the second support portion PLT2 of the support layer PLT may overlap the second non-folding region NFA2 (see FIG. 1A) of the electronic device ED (see FIG. 1A). At least one portion of the first support portion PLT1 and the second support portion PLT2 may overlap the non-display region NDA (see FIG. 1A) of the electronic device ED (see FIG. 1A). In an embodiment, the first support portion PLT1, the folding portion PLT-F and the second support portion PLT2 of the support layer PLT may have an integrated shape or be integrally formed with each other as a single unitary unit.

Referring to FIGS. 7A to 7C, a plurality of opening portions OP may be defined in the folding portion PLT-F of the support layer PLT. The plurality of opening portions OP may overlap the folding region FA (see FIG. 1A) of the electronic device ED (see FIG. 1A). The plurality of opening portions OP may be provided in a plurality of rows. The plurality of opening portions OP may be provided in a plurality of rows in a staggered arrangement. In an embodiment, the plurality of opening portions OP may include a plurality of first opening portions OP1 arranged in a first row, and a plurality of second opening portions OP2 arranged in a second row. The plurality of first opening portions OP1 may each extend in the first direction DR1 and may be spaced apart from each other in the first direction DR1. The plurality of second opening portions OP2 may each be spaced apart from the plurality of first opening portions OP1 in the second direction DR2. The second opening portions OP2 may extend in the first direction DR1 and may be spaced apart from each other in the first direction DR1. The plurality of first opening portions OP1 and the plurality of second opening portions OP2 may be alternately formed along the second direction DR2.

The plurality of opening portions OP may be defined or formed in various ways. In an embodiment, for example, the plurality of opening portions OP may be formed through a laser process or a microblasting process, but is not limited thereto.

The plurality of opening portions OP may each have a first width WT1 in the first direction DR1, and a second width WT2 in the second direction DR2. The first width WT1 of each of the plurality of opening portions OP may be greater than the second width WT2 of each of the plurality of opening portions OP. In an embodiment, the second width WT2 of each of the plurality of opening portions OP may be in a range of about 0.05 millimeter (mm) to about 0.2 mm. When the second width WT2 is less than about 0.05 mm, the process time for precise-processing may increase. When the second width WT2 is greater than about 0.2 mm, a grid pattern due to the plurality of opening portions OP may be visible externally.

The folding portion PLT-F may include a plurality of branch parts BR disposed between the opening portions OP which are adjacent to each other in the second direction DR2. Since the plurality of opening portions OP are defined in the folding portion PLT-F, the plurality of branch parts BR may be formed between the opening portions OP which are adjacent to each other in the second direction DR2. The plurality of branch parts BR may extend in the first direction DR1. The plurality of branch parts BR may each have a third width WT3 in the second direction DR2.

In an embodiment, the third width WT3 of each of the plurality of branch parts BR may be in a range of about 0.05 mm to about 0.3 mm. In such an embodiment where the third width WT3 of each of the plurality of branch parts BR is in the range above, damage to the branch parts BR may be minimized during formation of the plurality of opening portions OP, and the process time for forming the plurality of opening portions OP may be reduced. If the third width WT3 of each of the plurality of branch parts BR is less than about 0.05 mm, the process time for precise-processing may increase, or the plurality of branch parts BR may be damaged such that the opening portions OP adjacent to each other may be connected to each other. If the third width WT3 of each of the plurality of branch parts BR is greater than about 0.3 mm, folding characteristics in the folding portion PLT-F of the support layer PLT may deteriorate, thereby causing damage such as crack, in the folding portion PLT-F due to stress generated from the plurality of branch parts BR.

Referring to FIGS. 7E and 7F, the support layer PLT according to an embodiment may include a fiber-reinforced plastic. A first support portion PLT1 and a second support portion PLT2 of the support layer PLT may each include a fiber-reinforced plastic.

The support layer PLT may include a reinforcement fiber FB1 and FB2. The first support portion PLT1, a folding portion PLT-F and the second support portion PLT2 of the support layer PLT may include the reinforcement fiber FB1 and FB2. The reinforcement fiber FB1 and FB2 may contain an aramid fiber or contain at least two selected from an aramid fiber, a carbon fiber and a glass fiber. In an embodiment, for example, the reinforcement fiber FB1 and FB2 may contain an aramid fiber, or contain a carbon fiber and a glass fiber. The reinforcement fiber FB1 and FB2 may be formed with a single fiber strand. The reinforcement fiber FB1 and FB2 may be composed of an aggregate of a plurality of sub-fibers. In an embodiment, for example, the plurality of sub-fibers may be joined as a single bundle to constitute a single fiber strand.

In an embodiment where the reinforcement fiber FB1 and FB2 included in the support layer PLT contains an aramid fiber or contains a carbon fiber and a glass fiber together, the support layer PLT, if applied to an electronic device, may further improve antenna efficiency of the electronic device than a support layer containing a carbon fiber alone. In general, an electronic device may include antennas for wireless communication. In an electronic device including the support layer containing a carbon fiber alone, an antenna operation may be interrupted due to the carbon fiber having conductivity. That is, since the support layer including a carbon fiber alone may cut off radio frequency signals, the antenna efficiency of the electronic device may be reduced. In addition, a carbon fiber-reinforced plastic containing a carbon fiber has high strength and is thus not easily processed. In particular, since a chip produced during the processing of the carbon fiber-reinforced plastic may remain in a dust form and function as a conductive foreign matter, thereby leading to a decrease in the efficiency and reliability of the electronic device ED.

According to an embodiment of the invention, the support layer PLT may include, in place of the carbon fiber, an aramid fiber-reinforced plastic ("AFRP") containing the aramid fiber, or include a hybrid fiber-reinforced plastic ("HFRP") in which the glass fiber or the aramid fiber is mixed with the carbon fiber, thereby increasing the antenna efficiency of the electronic device and increasing the efficiency and reliability of the electronic device by preventing occurrence of conductive foreign matter during the processing, when compared to a conventional support layer formed of the carbon fiber alone.

In an embodiment, where the glass fiber or the aramid fiber is mixed with the carbon fiber, a mixing ratio of the carbon fiber and the glass fiber, and a mixing ratio of the carbon fiber and the aramid fiber, may each be in a range of about 10:90 to about 50:50. In an embodiment, for example, the mixing ratio of the carbon fiber and the glass fiber, and the mixing ratio of the carbon fiber and the aramid fiber, may each be in a range of about 30:70 to about 50:50. In such an embodiment, the content of the carbon fiber contained in the reinforcement fiber may be the same as or smaller than that of the glass fiber or the aramid fiber. In such an embodiment where the mixing ratio of the carbon fiber and the glass fiber, and the mixing ratio of the carbon fiber and the aramid fiber, are in the range above, the support layer PLT having high mechanical properties may be achieved, and the antenna efficiency deterioration and the occurrence of conductive foreign matter caused by the carbon fiber may be reduced, thereby improving the reliability of the electronic device.

In an embodiment, the reinforcement fiber FB1 and FB2 may include a plurality of fibers. The reinforcement fiber FB1 and FB2 may include a plurality of first fibers FB1 and a plurality of second fibers FB2 which extend in directions different from each other. The reinforcement fiber FB1 and FB2 may include the plurality of first fibers FB1 which extend in the first direction DR1 parallel with a folding axis FX, and the plurality of second fibers FB2 which extend in the second direction DR2 to cross the plurality of first fibers FB1 on a plane.

The support layer PLT may further include a matrix part RIN1 and RIN2. The first support portion PLT1, the folding portion PLT-F and the second support portion PLT2 of the support layer PLT may each further include the matrix part RIN1 and RIN2 in which the reinforcement fiber FB1 and FB2 is dispersed. The reinforcement fiber FB1 and FB2 may be dispersed and arranged in the matrix part RIN1 and RIN2. Each of the first support portion PLT1, the folding portion PLT-F and the second support portion PLT2 may include a first matrix part RIN1 in which the plurality of first fibers FB1 are dispersed, and a second matrix part RIN2 in which the plurality of second fibers FB2 are dispersed.

Each of the first matrix part RIN1 and the second matrix part RIN2 may include a polymer resin. In an embodiment, for example, each of the first matrix part RIN1 and the second matrix part RIN2 may include a polyepoxy-based resin, a polyester-based resin, a polyamide-based resin, a polycarbonate-based resin, a polypropylene-based resin, a polybutylene-based resin or a polyvinyl ester-based resin.

In an embodiment, the electronic device ED (see FIG. 1A) may be lightweight by including the fiber-reinforced plastic in the support layer PLT. In such an embodiment, the support layer PLT may include the fiber-reinforced plastic, thereby having a smaller weight than a metal material and exhibiting a modulus and strength similar to or lower than those of a metal plate. Accordingly, an embodiment of the electronic device ED (see FIG. 1A may not only have a small weight but also exhibit improved mechanical properties and reliability when compared to a case of including a metal support layer.

In an embodiment, the support layer PLT may include a polymer resin for the matrix part RIN1 and RIN2 and thus the shape thereof is more easily processed when compared to the metal plate. In an embodiment, for example, the shape of the support layer PLT including the fiber-reinforced plastic may be processed by using a laser cutting method. The opening portions OP may be easily formed in the support layer PLT by using the laser cutting method.

Referring to FIG. 7E, an embodiment of the support layer PLT may include a plurality of sub-support layers SPL1 and SPL2 stacked in the third direction DR3 that is a thickness direction. The plurality of sub-support layers SPL1 and SPL2 may each include or be formed of the fiber-reinforced plastic including the reinforcement fiber FB1 and FB2. The plurality of sub-support layers SPL1 and SPL2 may include a first sub-support layer SPL1 and a second sub-support layer SPL2. The first sub-support layer SPL1 may include a plurality of first fibers FB1 arranged parallel with the folding axis FX, and the second sub-support layer SPL2 may include a plurality of second fibers FB2 arranged parallel with a direction perpendicular to the folding axis FX. FIG. 7E illustrates an embodiment where the support layer PLT includes two first sub-support layers SPL1 and one second sub-support layer SPL2. However, an embodiment of the invention is not limited thereto. In an alternative embodiment, the first sub-support layer SPL1 and the second sub-support layer SPL2 may be alternately stacked in the third direction DR3.

The plurality of opening portions OP described above may be defined in each of the first sub-support layer SPL1 and the second sub-support layer SPL2. The plurality of opening portions OP may be defined in each of the first sub-support layer SPL1 and the second sub-support layer SPL2 which correspond to the folding portion PLT-F of the support layer PLT.

In an embodiment, the support layer PLT may include both the first sub-support layer SPL1 and the second sub-support layer SPL2 which respectively include the plurality of first fibers FB1 and the plurality of second fibers FB2 which extend in different directions, thereby having improved folding characteristics and exhibiting high mechanical strength. In such an embodiment, the support layer PLT may include the first sub-support layer SPL1 including the plurality of first fibers FB1 extending in a direction parallel with the folding axis FX, and the second sub-support layer SPL2 including the plurality of second fibers FB2 extending in a direction perpendicular to the folding axis FX, thereby exhibiting improved folding characteristics and excellent mechanical properties.

In an embodiment, when the support layer PLT includes the plurality of stacked sub-support layers SPL1 and SPL2, the arrangement direction of reinforcement fibers included in the uppermost sub-support layer and the lowest sub-support layer may be parallel with the folding axis FX. In an embodiment, the support layer PLT may include at least one sub-support layer that is disposed between the uppermost sub-support layer and the lowest sub-support layer including the reinforcement fiber arranged in the direction parallel with the folding axis FX, and that includes the reinforcement fiber arranged in a direction perpendicular to the folding axis FX.

In an embodiment, the support layer PLT may include n first sub-support layers SPL1 and n−1 second sub-support layers SPL2. Here, n may be an integer of 2 or greater. In an embodiment, for example, n may be 2 or 3, but is not limited thereto. In an embodiment, for example, the support layer PLT may include at least two first sub-support layers SPL1. Here, two of the first sub-support layers SPL1 may form or define surfaces of the support layer PLT. One of the two first sub-support layers SPL1 may form an upper surface of the support layer PLT, and the other may form a lower surface of the support layer PLT.

If the second sub-support layer SPL2 including the plurality of second fibers FB2 arranged perpendicular to the folding axis FX forms or defines the surface of the support layer PLT, the plurality of opening portions OP may not be effectively formed. In an embodiment, for example, if the plurality of opening portions OP extending in a direction parallel with the folding axis FX are formed in the second sub-support layer SPL2 including the plurality of second fibers FB2 arranged in a direction perpendicular to the folding axis FX, cut portions of the plurality of second fibers FB2 may outwardly protrude. That is, when the plurality of opening portions OP are formed to cross the plurality of second fibers FB2, the folding portion PLT-F of the support layer PLT, in which a pattern is formed, may have a rough surface.

According to an embodiment of the invention, since the first sub-support layer SPL1 including the plurality of first fibers FB1 arranged parallel with the folding axis FX define or form the surface of support layer PLT, the processing of the plurality of opening portions OP may be easier. That is, when the plurality of opening portions OP are formed in a direction parallel with the direction in which the plurality of first fibers FB1 extend, the folding portion PLT-F of the support layer PLT in which the plurality of opening portions OP are formed, may not have a rough surface.

An embodiment of the electronic device illustrated in FIG. 7G may be different in cross-sectional arrangement of a digitizer DGZ, from the electronic device illustrated in FIG. 6.

Referring to FIG. 7G, in an embodiment, a lower member of an electronic device may include an electromagnetic shielding layer EMS, a cover layer SCV disposed on the electromagnetic shielding layer EMS, a support layer PLT disposed on the cover layer SCV, and a digitizer DGZ disposed on the support layer PLT. Here, a sixth adhesive layer AL6 may attach the support layer PLT and the cover layer SCV to each other, and a seventh adhesive layer AL7 may attach the cover layer SCV and the electromagnetic shielding layer EMS to each other.

In an embodiment, as illustrated in FIG. 7G, the digitizer DGZ may be disposed on the support layer PLT. The digitizer DGZ may be disposed on the support layer PLT and overlap a first support portion PLT1, a folding portion PLT-F and a second support portion PLT2 of the support layer PLT. However, an embodiment of the invention is not limited thereto, and the digitizer DGZ may include a first digitizer and a second digitizer that are spaced apart from each other on the support layer PLT. As the digitizer DGZ is disposed on the support layer PLT, the electromagnetic shielding layer EMS may be attached below the cover layer SCV through the seventh adhesive layer AL7. A first electromagnetic shielding layer EMS1 may be attached below a first portion AL7-1 of the seventh adhesive layer AL7, and a second electromagnetic shielding layer EMS2 may be attached below a second portion AL7-2 of the seventh adhesive layer AL7.

Figure 8A:
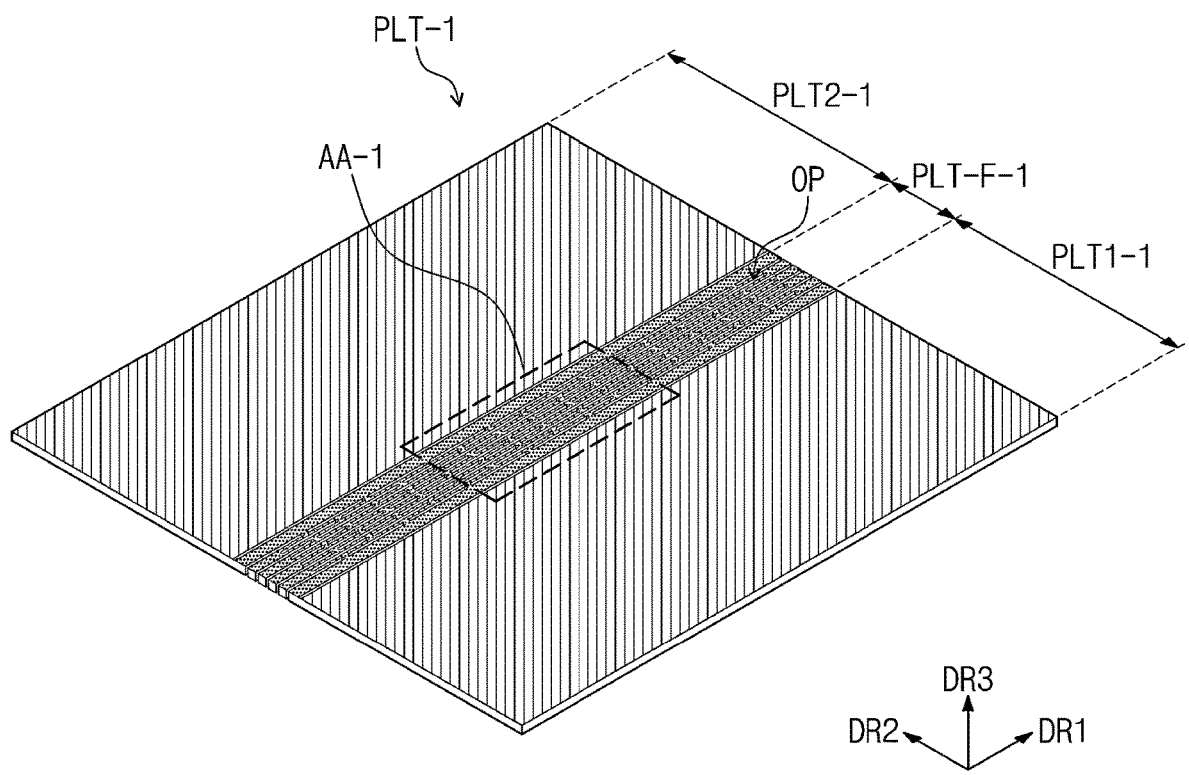
FIG. 8A is a perspective view of a support layer according to an embodiment of the invention.
Figure 8B:
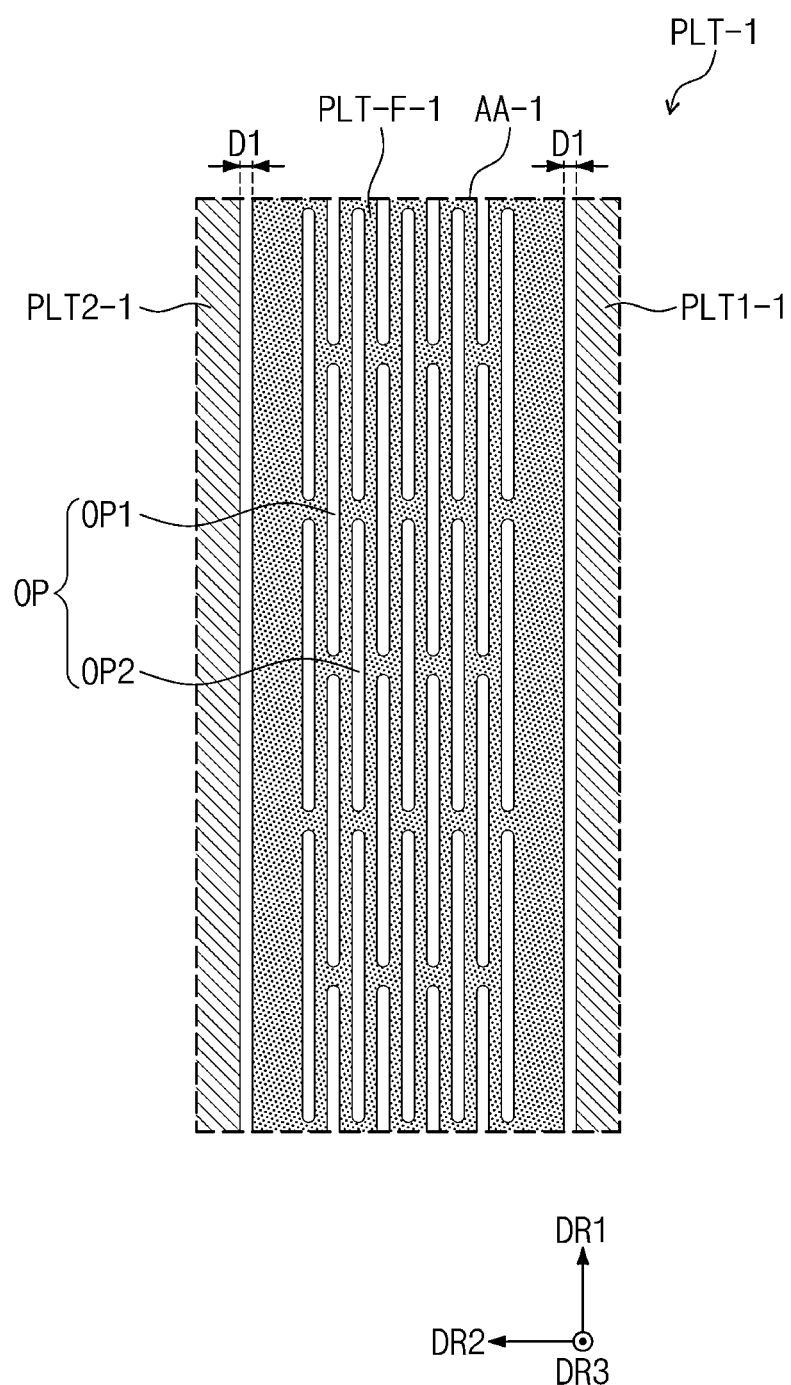
FIG. 8B is a partial plan view of a support layer according to an embodiment of the invention.
Figure 8C:
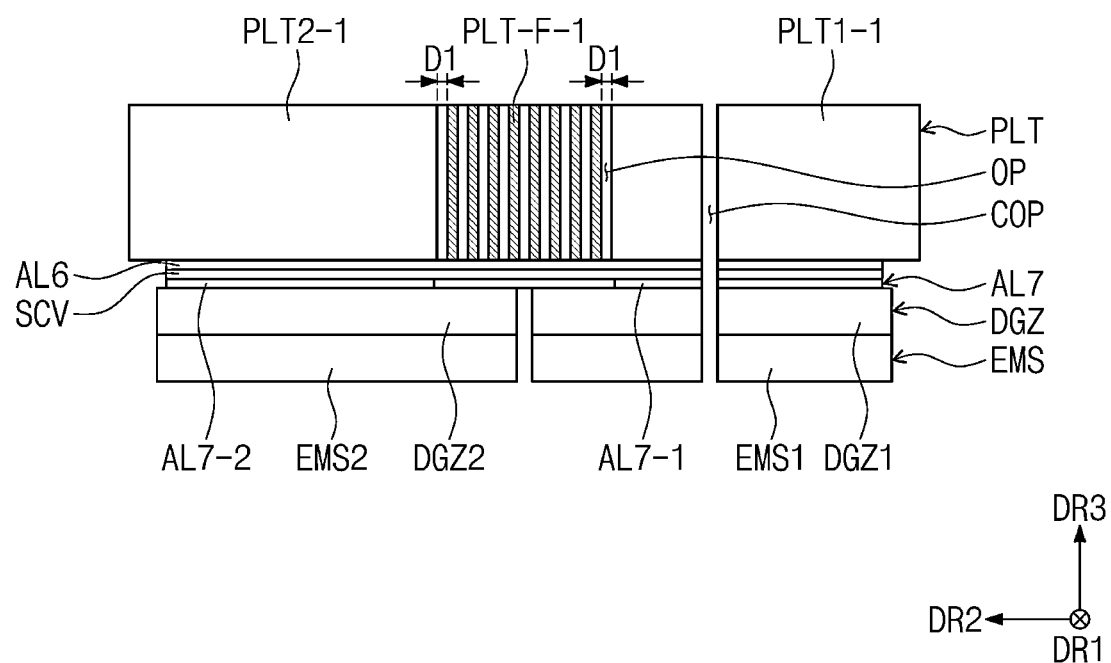
FIG. 8C is a partial cross-sectional view of an electronic device according to an embodiment of the invention.
Figure 8D:
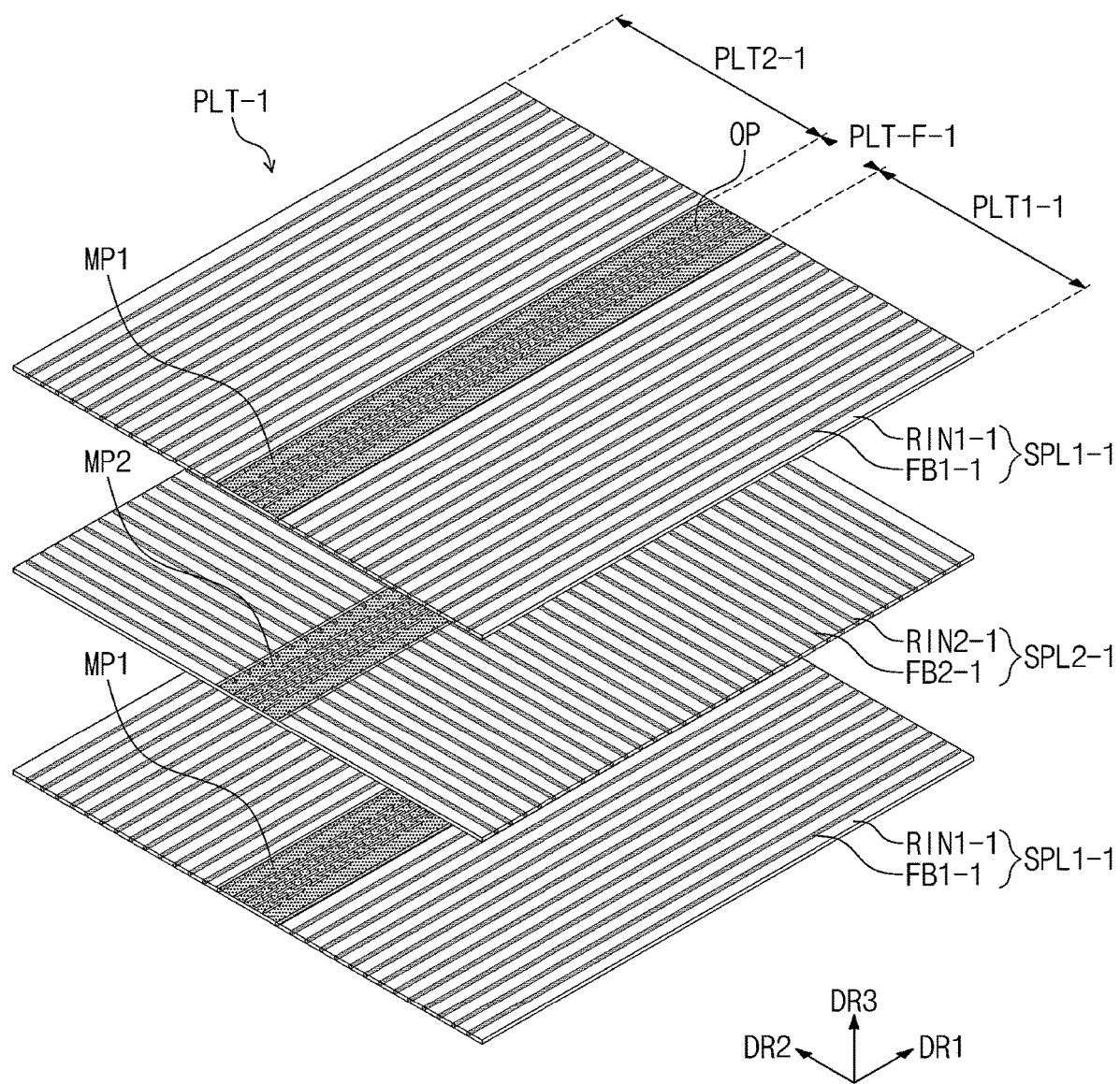
FIG. 8D is an exploded perspective view of a support layer according to an embodiment of the invention.

FIG. 8A is a perspective view of a support layer PLT according to an embodiment of the invention. FIG. 8B is a partial plan view of a support layer PLT according to an embodiment of the invention. FIG. 8B is an enlarged view of a partial region AA-1 in FIG. 8A. FIG. 8C is a partial cross-sectional view of an electronic device ED according to an embodiment of the invention. FIG. 8D is an exploded perspective view of a support layer PLT according to an embodiment of the invention.

In describing an electronic device according to an embodiment of the invention with reference to FIGS. 8A to 8D, the same or like components as those previously described with reference to FIGS. 6 and 7A to 7G are labeled as the same or like reference numbers or symbols, and any repetitive detailed description thereof will hereinafter be omitted or simplified.

Referring to FIG. 8A, in an embodiment, a support layer PLT-1 may include a first support portion PLT1-1, a folding portion PLT-F-1 and a second support portion PLT2-1 which are spaced apart in the second direction DR2. The first support portion PLT1-1 and the second support portion PLT2-1 may include the same material. Each of the first support portion PLT1-1 and the second support portion PLT2-1 may include a fiber reinforced plastic. In an embodiment, each of the first support portion PLT1-1 and the second support portion PLT2-1 may include a reinforcement fiber containing an aramid fiber or containing at least two selected from an aramid fiber, a carbon fiber and a glass fiber. In an embodiment, for example, each of the first support portion PLT1-1 and the second support portion PLT2-1 may include a reinforcement fiber containing an aramid fiber, or a reinforcement fiber containing a carbon fiber and a glass fiber.

In an embodiment, the folding portion PLT-F-1 of the support layer PLT-1 may include a material different from those of the first support portion PLT1-1 and the second support portion PLT2-1. The folding portion PLT-F-1 may include a material having an elastic modulus of about 60 Gpa or greater, or a metal material such as stainless steel. In an embodiment, for example, the folding portion PLT-F-1 may include SUS 304. However, an embodiment of the invention is not limited thereto, and the folding portion PLT-F-1 may include various metal materials.

The folding portion PLT-F-1 of the support layer PLT-1 may be spaced apart on a plane from the first support portion PLT1-1 and the second support portion PLT2-1. In an embodiment, as illustrated in FIG. 8B, the folding portion PLT-F-1 of the support layer PLT-1 may be spaced apart by a first distance D1 from each of the first support portion PLT1-1 and the second support portion PLT2-1. The first distance D1 may be from several micrometers to several tens of micrometers.

As illustrated in FIG. 8B, a plurality of opening portions OP defined or formed in the folding portion PLT-F-1 of the support layer PLT-1 may be arranged in a grid form. When the electronic device ED is folded as in FIG. 1B, the folding portion PLT-F-1 of the support layer PLT-1 may be elongated, and thus the folding operation may be easier. The first support portion PLT1-1, the folding portion PLT-F-1 and the second support portion PLT2-1 which are separated from each other may all be attached to the sixth adhesive layer AL6 as illustrated in FIG. 8C. Thus, when the electronic device ED is folded as in FIG. 1B, the first support portion PLT1-1, the folding portion PLT-F-1 and the second support portion PLT2-1 which are separated from each other may operate as if being a single member.

Although not illustrated, the support layer PLT-1 may further include coupling portions that couple the folding portion PLT-F-1 to the first support portion PLT1-1 and the second support portion PLT2-1, respectively. The coupling portions may be disposed in a spaced region between the folding portion PLT-F-1 and the first support portion PLT1-1, and a spaced region between the folding portion PLT-F-1 and the second support portion PLT2-1. In such an embodiment where the support layer PLT-1 further includes the coupling portions, the coupling portions may include plastic. In an embodiment, for example, after the folding portion PLT-F-1 is disposed to be spaced apart from each of the first support portion PLT1-1 and the second support portion PLT2-1, the coupling portions may be formed by injecting thermoplastic into the spaced region between the folding portion PLT-F-1 and the first support portion PLT1-1 and the spaced region between the folding portion PLT-F-1 and the second support portion PLT2-1. Here, the coupling portions may be formed in a state where the cover layer SCV (see FIG. 6) that covers the plurality of opening portions OP of the folding portion PLT-F-1 is attached.

Alternatively, unlike the illustrations in FIGS. 8A to 8C, the folding portion PLT-F-1 of the support layer PLT-1 may be coupled directly to each of the first support portion PLT1-1 and the second support portion PLT2-1. Here, each of the first support portion PLT1-1 and the second support portion PLT2-1 may be coupled directly to the folding portion PLT-F-1 through an insert molding method.

Referring to FIG. 8D, each of the first support portion PLT1-1 and the second support portion PLT2-1 may include a reinforcement fiber FB1-1 and FB2-1. The reinforcement fiber FB1-1 and FB2-1 may contain an aramid fiber or contain at least two selected from an aramid fiber, a carbon fiber and a glass fiber. In an embodiment, for example, the reinforcement fiber FB1-1 and FB2-1 may contain an aramid fiber, or contain a carbon fiber and a glass fiber. In an embodiment, the reinforcement fiber FB1-1 and FB2-1 may include a plurality of fibers. The reinforcement fiber FB1-1 and FB2-1 may include a plurality of first fibers FB1 extending in the first direction DR1 parallel with a folding axis FX, and a plurality of second fibers FB2 extending in the second direction DR2 to cross the plurality of first fibers FB1 on a plane.

Each of the first support portion PLT1-1 and the second support portion PLT2-1 may further include a matrix part RIN1-1 and RIN2-1. Each of the first support portion PLT1-1 and the second support portion PLT2-1 may include a first matrix part RIN1-1 in which the plurality of first fibers FB1-1 are dispersed, and a second matrix part RIN2-1 in which the plurality of second fibers FB2-1 are dispersed. Each of the first matrix part RIN1-1 and the second matrix part RIN2-1 may include a polymer resin. In an embodiment, for example, each of the first matrix part RIN1-1 and the second matrix part RIN2-1 may include a polyepoxy-based resin, a polyester-based resin, a polyamide-based resin, a polycarbonate-based resin, a polypropylene-based resin, a polybutylene-based resin or a polyvinyl ester-based resin.

In an embodiment, the support layer PLT-1, as illustrated in FIG. 8D, may include a first support portion PLT1-1 and a second support portion PLT2-1 which are spaced apart in the second direction DR2. Each of the first support portion PLT1-1 and the second support portion PLT2-1 may include a plurality of sub-support layers SPL1-1 and SPL2-1 stacked in the third direction DR3 that is a thickness direction. The plurality of sub-support layers SPL1-1 and SPL2-1 may include a first sub-support layer SPL1-1 including a plurality of first fibers FB1-1 arranged in the first direction DR1 parallel with the folding axis FX, and a second sub-support layer SPL2-1 including a plurality of second fibers FB2-1 arranged in the second direction DR2 perpendicular to the folding axis FX. The first sub-support layer SPL1-1 and the second sub-support layer SPL2-1 may be alternately stacked in the third direction DR3.

The support layer PLT-1 may include a folding portion PLT-F-1 disposed between the first support portion PLT1-1 and the second support portion PLT2-1, and the folding portion PLT-F-1 may include a plurality of sub-metal layers MP1 and MP2 stacked in the third direction DR3 that is a thickness direction. That is, the folding portion PLT-F-1 may include a first sub-metal layer MP1 and a second sub-metal layer MP2. The first sub-metal layer MP1 may be disposed between the first sub-support layer SPL1-1 of the first support portion PLT1-1 and the first sub-support layer SPL1-1 of the second support portion PLT2-1 which are spaced apart from each other. The second sub-metal layer MP2 may be disposed between the second sub-support layer SPL2-1 of the first support portion PLT1-1 and the second sub-support layer SPL2-1 of the second support portion PLT2-1 which are spaced apart from each other. The plurality of opening portions OP described above may be defined in each of the first sub-metal layer MP1 and the second sub-metal layer MP2. FIG. 8D illustrates an embodiment where the first sub-metal layer MP1 and the second sub-metal layer MP2 are separated from each other, but an embodiment of the invention is not limited thereto. Alternatively, the first sub-metal layer MP1 and the second sub-metal layer MP2 may have an integrated shape on the support layer PLT-1.

Figure 9A:
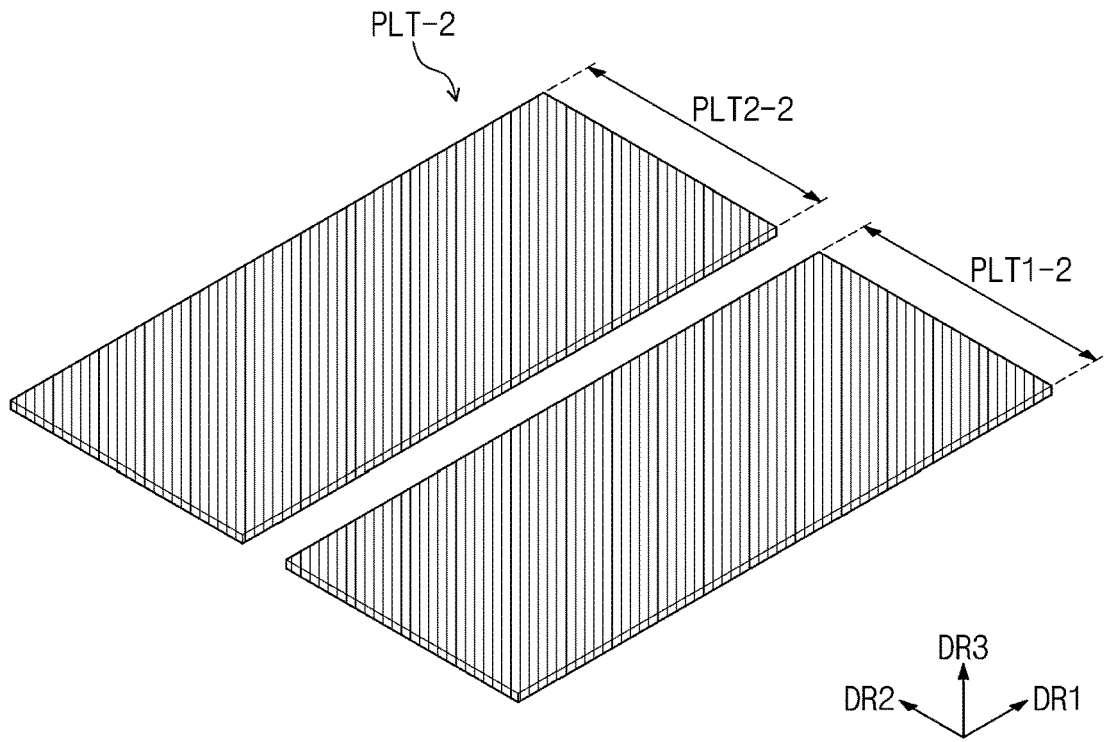
FIG. 9A is a perspective view of a support layer according to an embodiment of the invention.
Figure 9B:
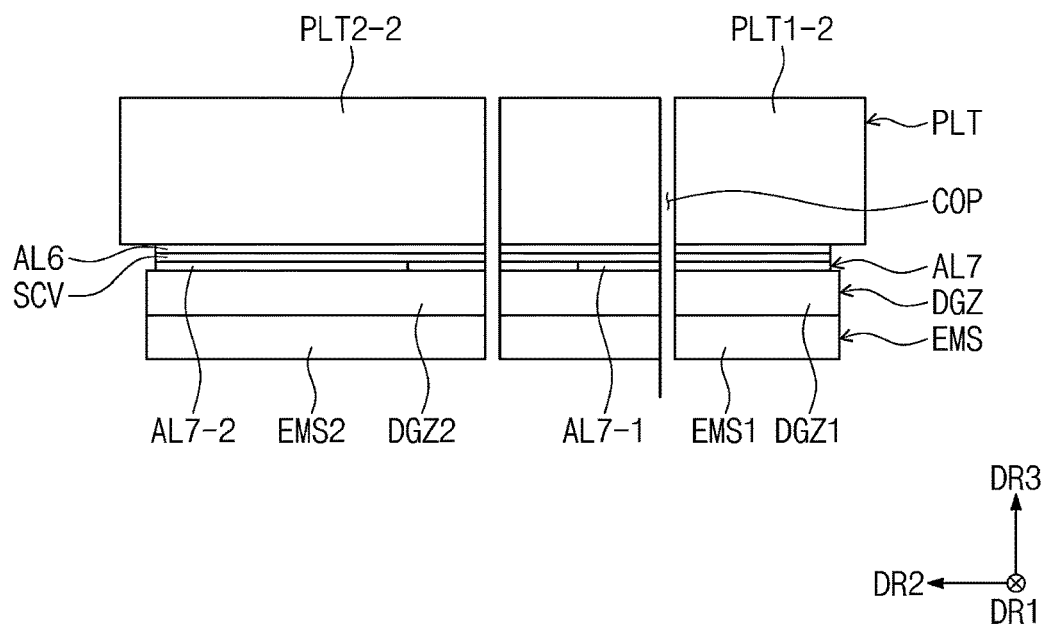
FIG. 9B is a partial cross-sectional view of an electronic device according to an embodiment of the invention.
Figure 9C:
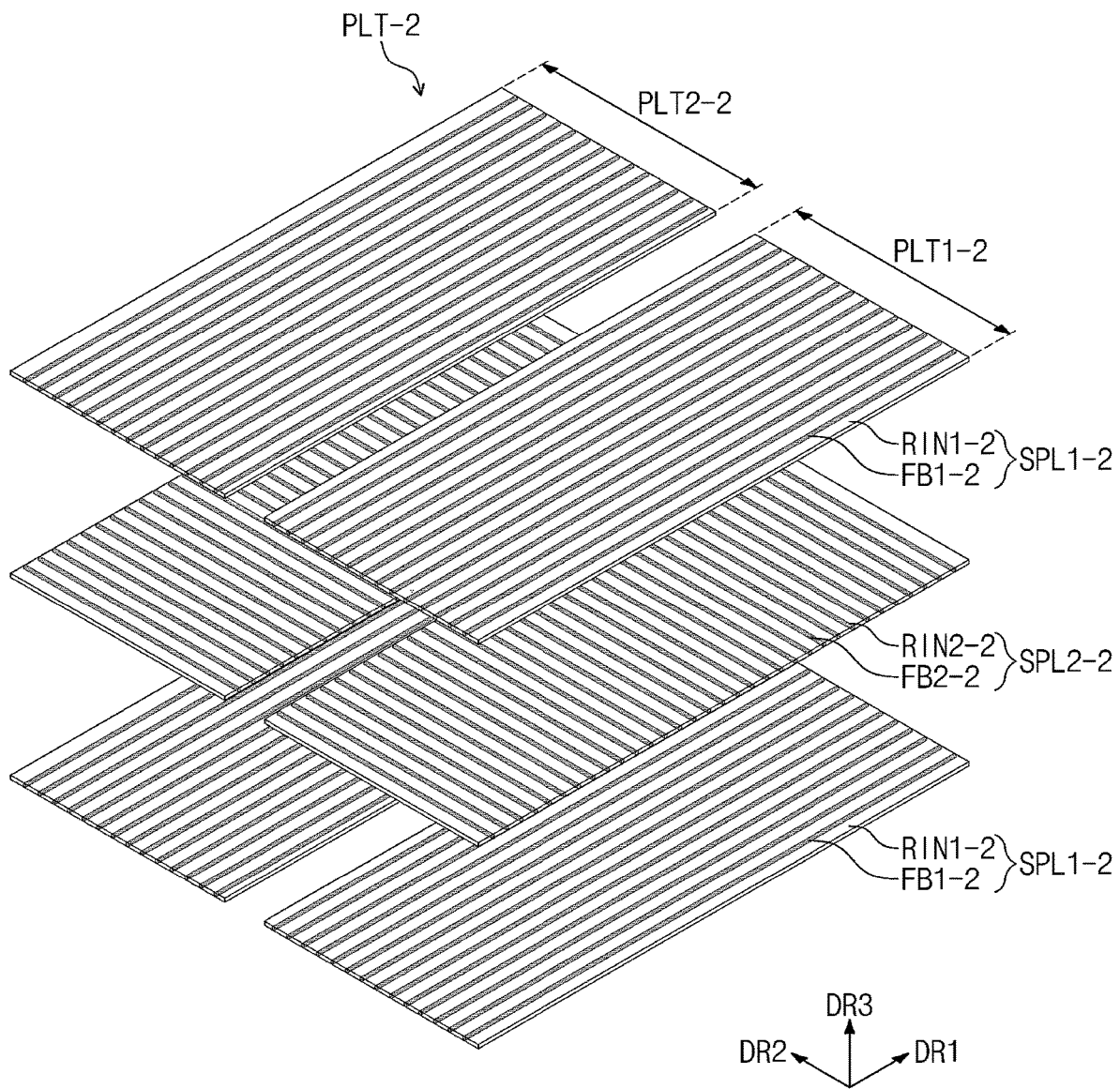
FIG. 9C is an exploded perspective view of a support layer according to an embodiment of the invention.

FIG. 9A is a perspective view of a support layer PLT-2 according to an embodiment of the invention. FIG. 9B is a partial cross-sectional view of an electronic device ED according to an embodiment of the invention. FIG. 9C is an exploded perspective view of a support layer PLT-2 according to an embodiment of the invention.

In describing an electronic device according to an embodiment of the invention with reference to FIGS. 9A to 9C, the same or like components as those previously described with reference to FIGS. 6 and 7A to 7G are labeled as like reference numbers or symbols, and any repetitive detailed description thereof will hereinafter be omitted or simplified.

Referring to FIGS. 9A to 9C, in an embodiment of a support layer PLT-2, a folding portion PLT-F may be omitted when compared with the support layer PLT illustrated in FIG. 6. In such an embodiment, the support layer PLT-2 may include a first support portion PLT1-2 and a second support portion PLT2-2 which are spaced apart from each other in the second direction DR2, and may not include the folding portion PLT-F illustrated in FIG. 6. The first support portion PLT1-2 may overlap the first non-folding region NFA1 (see FIG. 1A) of the electronic device ED (see FIG. 1A), and the second support portion PLT2-2 may overlap the second non-folding region NFA2 (see FIG. 1A) of the electronic device ED (see FIG. 1A). A gap by which the illustrated first support portion PLT1-2 and second support portion PLT2-2 are spaced apart from each other may overlap the folding region FA (see FIG. 1A) of the electronic device ED (see FIG. 1A). The gap by which the first support portion PLT1-2 and the second support portion PLT2-2 are spaced apart from each other may be smaller than the gap by which the first support portion PLT1 and the second support portion PLT2 illustrated in FIG. 6 are spaced apart from each other, but is not limited thereto.

Referring to FIG. 9C, each of the first support portion PLT1-2 and the second support portion PLT2-2 may include a reinforcement fiber FB1-2 and FB2-2. The reinforcement fiber FB1-2 and FB2-2 may contain an aramid fiber or contain at least two selected from an aramid fiber, a carbon fiber and a glass fiber. In an embodiment, for example, the reinforcement fiber FB1-2 and FB2-2 may contain an aramid fiber, or contain a carbon fiber and a glass fiber. In an embodiment, the reinforcement fiber FB1-2 and FB2-2 may include a plurality of fibers. The reinforcement fiber FB1-2 and FB2-2 may include a plurality of first fibers FB1-2 extending in the first direction DR1 parallel with a folding axis FX, and a plurality of second fibers FB2-2 extending in the second direction DR2 to cross the plurality of first fibers FB1-2 on a plane.

Each of the first support portion PLT1-2 and the second support portion PLT2-2 may further include a matrix part RIN1-2 and RIN2-2 in which the reinforcement fiber FB1-2 and FB2-2 is dispersed. Each of the first support portion PLT1-2 and the second support portion PLT2-2 may include a first matrix part RIN1-2 in which the plurality of first fibers FB1-2 are dispersed, and a second matrix part RIN2-2 in which the plurality of second fibers FB2-2 are dispersed. Each of the first matrix part RIN1-2 and the second matrix part RIN2-2 may include a polymer resin. In an embodiment, for example, each of the first matrix part RIN1-2 and the second matrix part RIN2-2 may include a polyepoxy-based resin, a polyester-based resin, a polyamide-based resin, a polycarbonate-based resin, a polypropylene-based resin, a polybutylene-based resin or a polyvinyl ester-based resin.

In an embodiment, the first support portion PLT1-2 and the second support portion PLT2-2 may include a plurality of sub-support layers SPL1-2 and SPL2-2 stacked in the third direction DR3 that is a thickness direction. Each of the first support portion PLT1-2 and the second support portion PLT2-2 may include a first sub-support layer SPL1-2 and a second sub-support layer SPL2-2. In an embodiment, for example, each of the first support portion PLT1-2 and the second support portion PLT2-2 may include a first sub-support layer SPL1-2 and a second sub-support layer SPL2-2 which are sequentially stacked one on another.

Referring to FIG. 9C, each of the plurality of sub-support layers SPL1-2 and SPL2-2 may be formed of a fiber reinforced plastic including a reinforcement fiber FB1-2 and FB2-2. The plurality of sub-support layers SPL1-2 and SPL2-2 may include a first sub-support layer SPL1-2 including the plurality of first fibers FB1-2 arranged parallel with the folding axis FX, and a second sub-support layer SPL2-2 including the plurality of second fibers FB2-2 arranged parallel with a direction perpendicular to the folding axis FX.

An embodiment of an electronic device may include a support layer including a fiber-reinforced plastic, thereby being lightweight, and the support layer may include at least one support layer including a reinforcement fiber arranged parallel with a direction in which a folding axis extends, thereby exhibiting high mechanical properties in a direction parallel with the folding axis. In such an embodiment, the electronic device may have the support layer including a plurality of sub-support layers different from each other in arrangement direction of the reinforcement fiber, thereby having improved folding characteristics and exhibiting high mechanical properties.

Figure 10A:
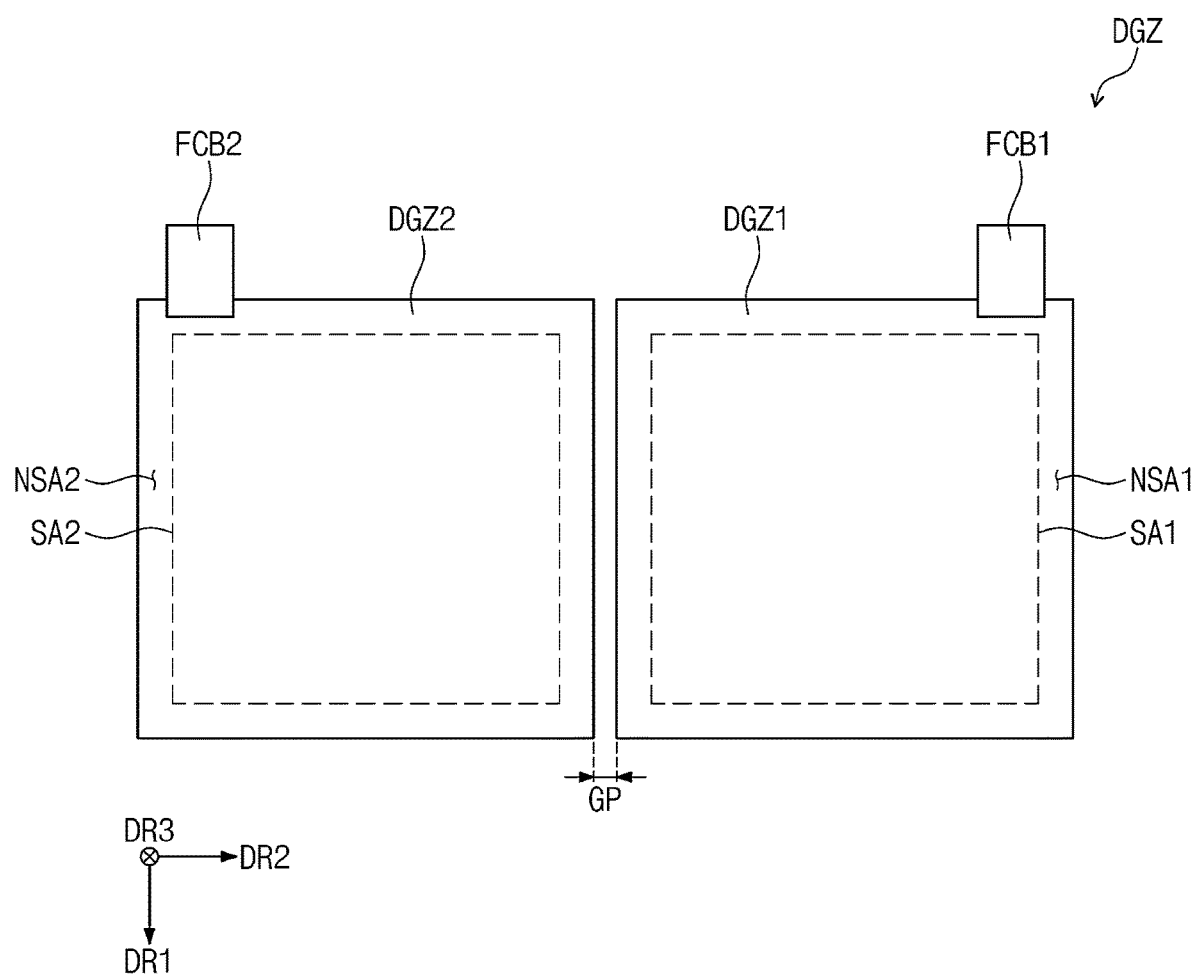
FIG. 10A is a plan view of a digitizer according to an embodiment of the invention.
Figure 10B:
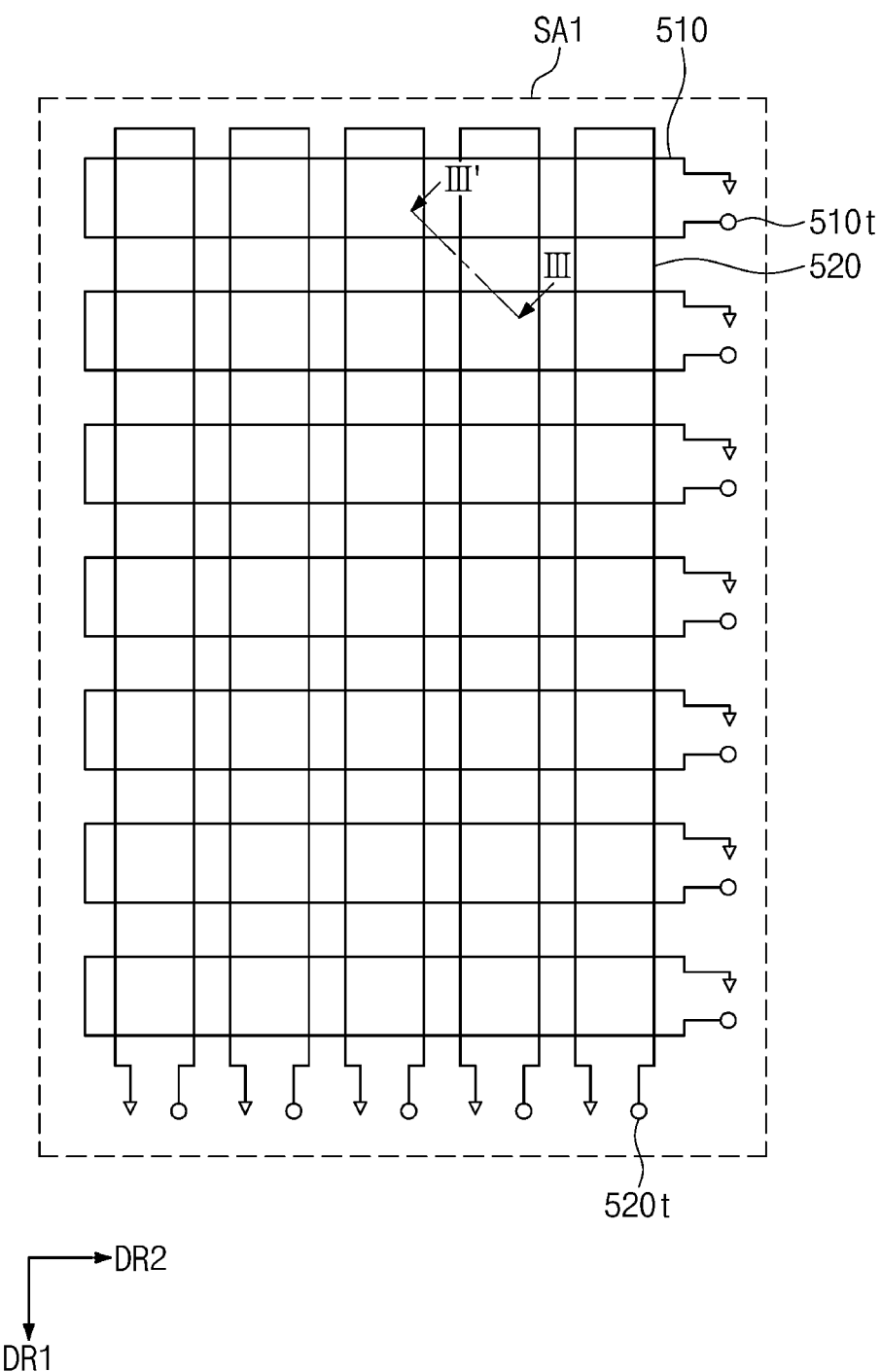
FIG. 10B is a plan view of a sensing region of a digitizer according to an embodiment of the invention.
Figure 10C:
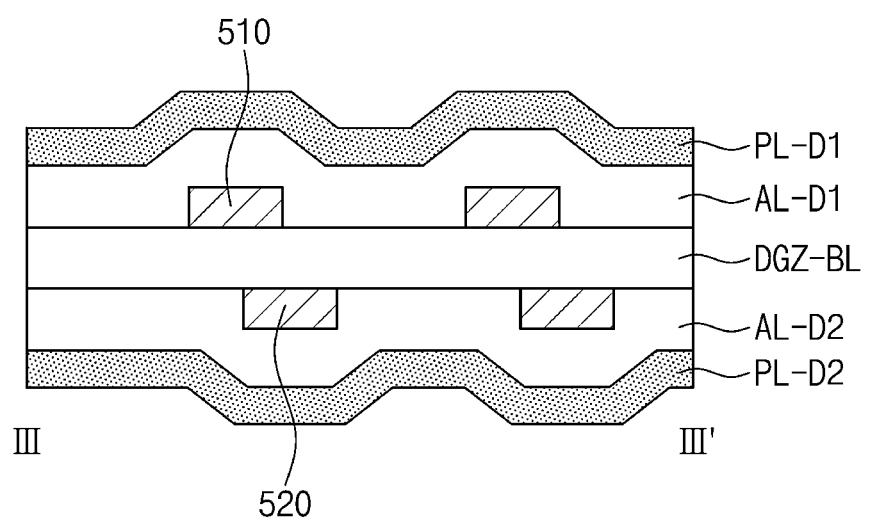
FIG. 10C is a cross-sectional view of a sensing region of a digitizer according to an embodiment of the invention.

FIG. 10A is a plan view of a digitizer DGZ according to an embodiment of the invention. FIG. 10B is a plan view of a sensing region SA1 of a digitizer DGZ according to an embodiment of the invention. FIG. 10C is a cross-sectional view of a sensing region SA1 of a digitizer DGZ according to an embodiment of the invention.

In an embodiment, as illustrated in FIG. 10A, a digitizer DGZ may include a first digitizer DGZ1 and a second digitizer DGZ2 which are spaced apart from each other. The first digitizer DGZ1 and the second digitizer DGZ2 may be arranged apart from each other with a predetermined gap GP therebetween. The gap GP may be in a range of about 0.3 mm to about 3 mm. In an embodiment, for example, the gap GP may be in a range of about 0.4 mm to about 2 mm. The gap GP may be defined to correspond to the folding region FA (see FIG. 1A) described above.

A first flexible circuit film FCB1 and a second flexible circuit film FCB2 may be electrically connected to the first digitizer DGZ1 and the second digitizer DGZ2, respectively. The first flexible circuit film FCB1 and the second flexible circuit film FCB2 may be connected to a same circuit board. In an embodiment, for example, each of the first flexible circuit film FCB1 and the second flexible circuit film FCB2 may be connected to the flexible circuit film FCB described with reference to FIG. 2A, a main circuit board connected to the flexible circuit film FCB, or the like. Alternatively, the first flexible circuit film FCB1 and the second flexible circuit film FCB2 may be replaced with a single circuit film.

The first digitizer DGZ1 and the second digitizer DGZ2 include a first sensing region SA1 and a second sensing region SA2, respectively, and include a first non-sensing region NSA1 and a second non-sensing region NSA2, respectively. The first non-sensing region NSA1 and the second non-sensing region NSA2 are disposed adjacent to the first sensing region SA1 and the second sensing region SA2, respectively. Since the configuration of the first digitizer DGZ1 is substantially the same as that of the second digitizer DGZ2, for convenience of description, the first digitizer DGZ1 will hereinafter be mainly described in detail.

As illustrated in FIG. 10B, the sensing region SA1 may include a plurality of first loop coils 510 (hereinafter first coils) and a plurality of second loop coils 520 (hereinafter second coils). The first coils 510 may be referred to as driving coils, and the second coils 520 may be referred to as sensing coils, and vice versa without being limited thereto.

Each of the first coils 510 is arranged along the first direction DR1 and extends along the second direction DR2. Each of the second coils 520 may extend along the first direction DR1 and the second coils 520 may be arranged apart from each other in the second direction DR2. Unlike the illustration in FIG. 10B, the first coils 510 may be arranged such that neighboring coils overlap each other. A bridge pattern may be disposed in a crossing region of the first coils 510. The second coils 520 may be arranged such that neighboring coils overlap each other. A bridge pattern may be disposed in a crossing region of the second coils 520.

Alternate current signals may be successively supplied to first terminals 510t of the first coils 510. The first terminals 510t of the first coils 510 and terminals of the other may be grounded. Signal lines may be connected to the respective first terminals 510t of the first coils 510, which is not illustrated in FIG. 10B. These signal lines may be disposed in the non-sensing region NSA1 illustrated in FIG. 10A.

When a current flows in the first coils 510, lines of magnetic force may be induced between the first coils 510 and the second coils 520. The second coils 520 may sense the induced electromagnetic field emitted from an electronic pen and output the induced electromagnetic field as a sensed signal to second terminals 520t of the second coils 520. The second terminals 520t of the second coils 520 and terminals of the other may be grounded. Signal lines may be connected to the respective second terminals 520t of the second coils 520, which is not illustrated in FIG. 10B. These signal lines may be disposed in the non-sensing region NSA1 illustrated in FIG. 10A.

Referring to FIGS. 10A to 10C together, the first digitizer DGZ1 includes a base layer DGZ-BL, first coils 510 disposed on one surface of the base layer DGZ-BL, and second coils 520 disposed on the other surface of the base layer DGZ-BL. The base layer DGZ-BL may include a plastic film, and may include, for example, a polyimide film. The first coils 510 and the second coils 520 may include a metal, and may include gold (Au), silver (Ag), copper (Cu), aluminum (Al) or the like.

Protective layers that protect the first coils 510 and the second coils 520 may be disposed on the one surface and the other surface of the base layer DGZ-BL. In such an embodiment, the protective layers may include a first protective layer PL-D1 disposed on the first coils 510 and attached through a first adhesive layer AL-D1, and a second protective layer PL-D2 disposed on the second coils 520 and attached through a second adhesive layer AL-D2. Each of the first protective layer PL-D1 and the second protective layer PL-D2 may include plastic and may include a polyimide film.

In an embodiment, as illustrated in FIG. 10C, bends may occur on an upper surface and a lower surface of the first digitizer DGZ1. The bends occurred on the upper surface and the lower surface of the first digitizer DGZ1 may cause a defect in which the first coils 510 and the second coils 520 are visible to a user. However, the support layer PLT (see FIG. 6) disposed on the digitizer DGZ may prevent the bends occurred due to the first coils 510 and the second coils 520 from being transferred to the upper side. That is, the support layer PLT (see FIG. 6) may prevent a defect in which the first coils 510 and the second coils 520 disposed thereunder are visible from the upper side of the electronic device.

In an embodiment, as described above, since the support layer PLT (see FIG. 6) has a non-metal material having insulating properties, a magnetic field may pass through the support layer PLT (see FIG. 6). The digitizer DGZ disposed below the support layer PLT (see FIG. 6) may sense external pressure. In a case where the support layer PLT (see FIG. 6) includes a metal material, the magnetic field generated in the digitizer DGZ due to the metal material included in the support layer PLT (see FIG. 6) interferes and thus the sensitivity of the digitizer DGZ is reduced. However, according to an embodiment of the invention, as described above, since the support layer PLT (see FIG. 6) has a non-metal material having insulating properties, such a phenomenon may not occur.

Hereinafter, an embodiment of the invention will be described in more detail with reference to characteristic values when a support layer according to each of Examples and Comparative Examples is applied to an electronic device. Examples below are provided only to assist with an understanding of the disclosure, and the scope of the invention is not limited thereto.

1. Electronic Device Characteristic Evaluation

Tables 1 and 2 below show characteristic evaluation data about electronic devices of Examples and Comparative Examples. In Examples 1 to 5 in Table 1, measurement results of storage modulus, pen recognition performance, antenna efficiency and conductive foreign matter occurrence rate are provided for an electronic device that includes a support layer according to an embodiment of the invention and has the stacked structure illustrated in FIG. 6. In Comparative Examples 1 to 3 in Table 2, measurement results of storage modulus, pen recognition performance, antenna efficiency and conductive foreign matter occurrence rate are provided for an electronic device that includes a support layer different from that according to an embodiment of the invention. The electronic devices of Examples and Comparative Examples include the same components as each other except for the support layer. The details of each of the support layers included in the electronic devices of Examples and Comparative Examples are shown in Tables below. Example 1 includes a support layer containing an aramid fiber, Examples 2 and 3 each include a support layer containing a carbon fiber and a glass fiber, and Examples 4 and 5 each include a support layer containing a carbon fiber and an aramid fiber. Comparative Example 1 includes a support layer containing a carbon fiber alone, Comparative Example 2 includes a support layer containing a glass fiber alone, and Comparative Example 3 includes a support layer formed of SUS.

(1) Storage Modulus

Storage moduli of upper plates included in Examples and Comparative Examples were measured. The storage moduli were measured according to JIS K 7074-1988 (Testing Methods for Flexural Properties of Carbon Fiber Reinforced Plastics).

(2) Pen Recognition Performance Evaluation

It was checked whether it is possible to draw, with an EMR pen, a straight line on each of display devices of Examples and Comparative Examples.

(3) Antenna Efficiency Evaluation

The antenna efficiency evaluation for Examples and Comparative Examples was performed according to an antenna efficiency measurement method disclosed in "Telecommunication Dissemination Foundation Research Survey Report, No. 32, 2017". A case that there is no efficiency deterioration was determined as "no efficiency deterioration", a case that efficiency deterioration is less than about 10% was determined as "small", and a case that efficiency deterioration is about 10% or greater was determined as "large".

(3) Conductive Foreign Matter Occurrence Rate

In order to analyze processing characteristics of the support layers included in Examples and Comparative Examples, grid pattern processing was performed to form a plurality of opening portions in a folding portion of each of the support layers. Examples 1 to 5 and Comparative Examples 1 and 2 were subjected to $CO_2$ laser processing, and Comparative Example 3 including SUS was subjected to an etching process using ferric chloride as an etchant. The processing characteristics was analyzed by observing with a microscope whether and how many conductive foreign matter was produced on the upper plates after the grid pattern was processed.

TABLE 1

|  | Example 1 | Example 2 | Example 3 | Example 4 | Example 5 |
| --- | --- | --- | --- | --- | --- |
| Support layer | Aramid fiber | Carbon fiber and Glass fiber | Carbon fiber and Glass fiber | Carbon fiber and Aramid fiber | Carbon fiber and Aramid fiber |
| Ratio of reinforcement fibers | Aramid fiber 100% | Carbon fiber:Glass fiber (30:70) | Carbon fiber:Glass fiber (50:50) | Carbon fiber:Aramid fiber (30:70) | Carbon fiber:Aramid fiber (50:50) |
| Storage modulus (Gpa) | 110 | 90 | 110 | 140 | 160 |
| Pen recognition performance | Possible | Possible | Possible | Possible | Possible |
| Antenna efficiency deterioration rate | No efficiency deterioration | Small | Small | Small | Small |
| Conductive foreign matter occurrence rate | None | Small amount | Small amount | Small amount | Small amount |

TABLE 2

|  | Comparative Example 1 | Comparative Example 2 | Comparative Example 3 |
| --- | --- | --- | --- |
| Support layer | Carbon fiber | Glass fiber | SUS |
| Ratio of reinforcement fibers | Carbon fiber 100% | Glass fiber 100% | SUS 100% |
| Storage modulus (Gpa) | 230 | 35 | 200 |
| Pen recognition performance | Possible | Possible | Impossible |
| Antenna efficiency deterioration rate | Large | No efficiency deterioration | Small |
| Conductive foreign matter occurrence rate | Large amount | None | Small amount |

Referring to the results in Tables 1 and 2, it may be confirmed that the electronic device including the support layer according to an embodiment has improved pen recognition performance, antenna efficiency and conductive foreign matter occurrence rate, when compared to Comparative Examples. It is demonstrated that when compared to the support layer containing a carbon fiber alone, the support layer containing a glass fiber alone, and the support layer formed of a metal material, the electronic device including the support layer according to an embodiment has excellent pen recognition performance, exhibits no antenna efficiency deterioration, and exhibits a small occurrence rate of conductive foreign matter, thereby improving the durability and reliability of the electronic device. In addition, since the electronic device according to an embodiment has a low storage modulus when compared to the support layer including a carbon fiber alone and the support layer formed of a metal material, the flexibility of the support layer is improved and therefore, the electronic device according to an embodiment may have excellent flexural reliability.

It may be confirmed that in Comparative Example 1 including the support layer containing a carbon fiber alone, the pen recognition performance was maintained but both the antenna efficiency deterioration rate and the conductive foreign matter occurrence rate increased.

In Comparative Example 2 including the support layer containing a glass fiber alone, the pen recognition performance was maintained, and both the antenna efficiency deterioration rate and the conductive foreign matter occurrence rate were very small. However, the storage modulus in Comparative Example 2, was significantly lower than those in Examples, the support layer of Comparative Example 2 is not hard enough to withstand structural deformation and thus may not ensure the durability and reliability when used in a foldable electronic device, a bendable electronic device or the like.

Comparative Example 3 including the support layer containing SUS alone shows relatively small rates of the antenna efficiency deterioration and conductive foreign matter occurrence when compared to Comparative Example 1 including a carbon fiber. However, pen recognition was verified to be impossible.

According to an embodiment of the invention, a support layer may include a fiber reinforced plastic, thereby providing an electronic device that has not only a small weight but also high flexibility and improved mechanical properties.

In addition, according to an embodiment of the invention, the support layer may include a reinforcement fiber containing an aramid fiber or containing a carbon fiber and a glass fiber, thereby increasing the sensitivity and antenna efficiency of a digitizer and preventing occurrence of conductive foreign matter. Therefore, the efficiency and reliability of the electronic device may be improved.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. An electronic device comprising:
   a display panel including a folding region, which is foldable with respect to a folding axis extending in one direction, and a first non-folding region and a second non-folding region spaced apart from each other with the folding region therebetween; and
   a lower member disposed below the display panel,
   wherein the lower member includes
      a support layer disposed below the display panel, wherein the support layer includes a first support portion overlapping the first non-folding region, and a second support portion overlapping the second non-folding region, and
      a digitizer disposed below the display panel to correspond to the first support portion and the second support portion,
   wherein the first support portion and the second support portion each independently comprises a reinforcement fiber, wherein the reinforcement fiber includes an aramid fiber or includes a carbon fiber and a glass fiber, and
   wherein the support layer comprises a plurality of sub-support layers in which an arrangement direction of the reinforcement fiber are different from each other,
   the plurality of sub-support layers are stacked along a thickness direction.

2. The electronic device of claim 1, wherein the reinforcement fiber comprises:
   a plurality of first fibers extending in the one direction; and
   a plurality of second fibers extending to cross the plurality of first fibers on a plane.

3. The electronic device of claim 1, wherein the plurality of sub-support layers comprises:
   a first sub-support layer including a plurality of first fibers arranged parallel with the one direction; and
   a second sub-support layer including a plurality of second fibers arranged parallel with a direction perpendicular to the one direction.

4. The electronic device of claim 1, wherein each of the first support portion and the second support portion further comprises a matrix part in which the reinforcement fiber is dispersed.

5. The electronic device of claim 1, wherein the support layer further comprises a folding portion disposed between the first support portion and the second support portion to correspond to the folding region, wherein a plurality of opening portions is defined in the folding portion.

6. The electronic device of claim 5, wherein the folding portion comprises the reinforcement fiber.

7. The electronic device of claim 5, wherein the folding portion comprises a metal.

8. The electronic device of claim 1, wherein the digitizer is disposed between the display panel and the support layer.

9. The electronic device of claim 1, wherein the digitizer is disposed below the support layer.

10. The electronic device of claim 1, wherein the digitizer comprises a first digitizer including a first sensing region corresponding to the first support portion, and a second digitizer including a second sensing region corresponding to the second support portion, wherein the second digitizer is spaced apart from the first digitizer.

11. The electronic device of claim 1, wherein the lower member further comprises:
   an electromagnetic shielding layer disposed below the digitizer; and
   a lower metal plate disposed below the electromagnetic shielding layer.

12. The electronic device of claim 1, wherein the lower member further comprises a cover layer disposed below the support layer and overlapping the folding region, the first non-folding region and the second non-folding region.

13. An electronic device comprising:
   a display panel including a folding region folded with respect to a folding axis extending in one direction, and a first non-folding region and a second non-folding region spaced apart from each other with the folding region therebetween; and
   a lower member disposed below the display panel,
   wherein the lower member includes a support layer disposed below the display panel, wherein the support layer includes a first support portion overlapping the first non-folding region, and a second support portion overlapping the second non-folding region,
   wherein the first support portion and the second support portion each independently comprises a reinforcement fiber, wherein the reinforcement fiber includes an aramid fiber or includes at least two selected from the aramid fiber, a carbon fiber and a glass fiber, and
   wherein the support layer comprises a plurality of sub-support layers in which an arrangement direction of the reinforcement fiber are different from each other,
   the plurality of sub-support layers are stacked along a thickness direction.

14. The electronic device of claim 13, wherein the reinforcement fiber comprises:

a plurality of first fibers extending in the one direction; and a plurality of second fibers extending to cross the plurality of first fibers on a plane.

15. The electronic device of claim 13, further comprising:
a digitizer disposed between the display panel and the support layer,
wherein the digitizer overlaps the first non-folding region, the folding region and the second non-folding region.

16. The electronic device of claim 13, further comprising:
a digitizer disposed below the support layer,
wherein the digitizer includes a first digitizer including a first sensing region corresponding to the first support portion, and a second digitizer including a second sensing region corresponding to the second support portion, wherein the second digitizer is spaced apart from the first digitizer.

17. The electronic device of claim 13, wherein the support layer further comprises a folding portion disposed between the first support portion and the second support portion to correspond to the folding region, wherein a plurality of opening portions is defined in the folding portion.

18. The electronic device of claim 17, wherein the folding portion comprises a metal.

19. The electronic device of claim 17, wherein
the folding portion comprises the reinforcement fiber, and
the first support portion, the second support portion and the folding portion are integrally formed with each other as a single unit.

\* \* \* \* \*